(12) United States Patent
Kim et al.

(10) Patent No.: US 12,543,470 B2
(45) Date of Patent: Feb. 3, 2026

(54) COLOR CONVERSION SUBSTRATE INCLUDING LOW REFRACTIVE LAYER WITH INCREASING THICKNESS, DISPLAY DEVICE INCLUDING THE SAME

(71) Applicant: Samsung Display Co., LTD., Yongin-si (KR)

(72) Inventors: Jeongki Kim, Hwaseong-si (KR); Hakbum Choi, Cheonan-si (KR); Jang-Il Kim, Anyang-si (KR); Jong-Hoon Kim, Seoul (KR); Sujin Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 308 days.

(21) Appl. No.: 18/165,236

(22) Filed: Feb. 6, 2023

(65) Prior Publication Data
US 2023/0397469 A1 Dec. 7, 2023

(30) Foreign Application Priority Data
Jun. 3, 2022 (KR) ........................ 10-2022-0068140

(51) Int. Cl.
*H10K 59/38* (2023.01)
(52) U.S. Cl.
CPC ................... *H10K 59/38* (2023.02)
(58) Field of Classification Search
CPC ........... H10K 59/8722; H10K 50/8426; H10K 59/873; H10K 50/844; H10K 59/879; H10K 59/38; H10K 50/858
See application file for complete search history.

(56) References Cited

U.S. PATENT DOCUMENTS

| 2020/0026135 | A1* | 1/2020 | Ki ..................... G02F 1/133528 |
| 2020/0027942 | A1* | 1/2020 | Kodama .............. H10K 59/126 |
| 2020/0219938 | A1 | 7/2020 | Ahn et al. |
| 2021/0384461 | A1* | 12/2021 | Kim ..................... H10K 59/40 |
| 2021/0399068 | A1 | 12/2021 | Kim et al. |
| 2022/0109123 | A1 | 4/2022 | Ahn et al. |
| 2023/0345791 | A1* | 10/2023 | Kim .................. H10K 59/8792 |

FOREIGN PATENT DOCUMENTS

| KR | 10-2020-0011056 A | 2/2020 |
| KR | 10-2020-0086774 A | 7/2020 |
| KR | 10-2021-0157932 A | 12/2021 |
| KR | 10-2022-0046028 A | 4/2022 |

OTHER PUBLICATIONS

Korean Office Action with translation corresponding to KR Application No. 10-2022-0068140, dated Dec. 16, 2025 (18 pages).

* cited by examiner

*Primary Examiner* — Nduka E Ojeh
(74) *Attorney, Agent, or Firm* — Womble Bond Dickinson (US) LLP

(57) ABSTRACT

A color conversion substrate, a display device including the color conversion substrate, and a method of manufacturing the color conversion substrate are provided. The color conversion substrate includes: a first base substrate including a first area, a second area around the first area, and a third area around the second area; a sealing member on the first base substrate and in the second area; a color filter layer on the first base substrate and under the sealing member; and a low refractive layer on the color filter layer, under the sealing member, and increasing in thickness from the third area to the second area in at least a portion of the third area.

14 Claims, 31 Drawing Sheets

COLOR CONVERSION SUBSTRATE INCLUDING LOW REFRACTIVE LAYER WITH INCREASING THICKNESS, DISPLAY DEVICE INCLUDING THE SAME

CROSS-REFERENCE TO RELATED APPLICATION(S)

This application claims priority to and the benefit of Korean Patent Application No. 10-2022-0068140, filed on Jun. 3, 2022, in the Korean Intellectual Property Office (KIPO), the entire content of which is incorporated by reference herein.

BACKGROUND

1. Field

One or more aspects of embodiments of the present disclosure are directed to a display device, and particularly, to a color conversion substrate, a display device including the same, and a method of manufacturing the color conversion substrate.

2. Description of the Related Art

A display device is a device that displays an image for providing visual information to a user. Representative examples of such the display device may include a liquid crystal display device and an organic light emitting display device.

Recently, in order to improve display quality, a display device including a display substrate including a plurality of pixels and a color conversion substrate including a color filter layer and a color conversion layer has been proposed. The color conversion layer may convert a wavelength of light provided from the display substrate. Accordingly, the display device including the color conversion layer may be to emit light having a color different from that of the incident light. For example, the color conversion layer may include wavelength conversion particles such as quantum dots.

SUMMARY

One or more aspects of embodiments of the present disclosure are directed to a color conversion substrate with improved reliability.

One or more aspects of embodiments of the present disclosure are directed to a display device including the color conversion substrate.

One or more aspects of embodiments of the present disclosure are directed to a method of manufacturing the color conversion substrate.

Additional aspects will be set forth in part in the description which follows and, in part, will be apparent from the description, or may be learned by practice of the presented embodiments.

One or more embodiments of the present disclosure provide a color conversion substrate including: a first base substrate including a first area, a second area around (e.g., surrounding) the first area, and a third area around (e.g., surrounding) the second area; a sealing member on the first base substrate and in the second area; a color filter layer on the first base substrate and under the sealing member; and a low refractive layer on the color filter layer, under the sealing member, and increasing in thickness from the third area to the second area in at least a portion of the third area.

In one or more embodiments, a portion of the low refractive layer overlapping the first area and the second area may have a greater thickness than a portion of the low refractive layer overlapping the third area.

In one or more embodiments, the low refractive layer may include an organic material.

In one or more embodiments, the color conversion substrate may further include a protective layer on the low refractive layer.

In one or more embodiments, a side surface of the color filter layer and a side surface of the protective layer may be exposed.

In one or more embodiments, the protective layer may cover an end of the low refractive layer.

In one or more embodiments, the protective layer may expose a side surface of the low refractive layer, and a thickness of the exposed side surface of the low refractive layer may be more than about 0 and about 0.7 micrometers or less.

In one or more embodiments, trenches may be defined in the color filter layer.

In one or more embodiments, the trenches may overlap the sealing member, and a portion of the low refractive layer may be disposed to fill an inside of the trench.

One or more embodiments of present disclosure provide a display device including: a first base substrate including a first area, a second area around (e.g., surrounding) the first area, and a third area around (e.g., surrounding) the second area; a second base substrate facing the first base substrate; a sealing member between the first base substrate and the second base substrate; a color filter layer under the first base substrate and on the sealing member; and a low refractive layer under the color filter layer, on the sealing member, and increasing in thickness from the third area to the second area in at least a portion of the third area.

In one or more embodiments, a portion of the low refractive layer overlapping the first area and the second area may have a greater thickness than a portion of the low refractive layer overlapping the third area.

In one or more embodiments, the display device may further include a protective layer under the low refractive layer.

In one or more embodiments, the protective layer may cover the low refractive layer, and a thickness of a side surface of the low refractive layer may be about 0.7 micrometers or less.

In one or more embodiments, trenches overlapping the sealing member may be defined in the color filter layer.

One or more embodiments of the present disclosure provide a method of manufacturing a color conversion substrate including: forming a first base mother substrate including an effective area and an ineffective area around (e.g., surrounding) the effective area and defining a cutting line positioned in a boundary between the effective area and the ineffective area; forming a color filter layer on the first base mother substrate, wherein the color filter layer overlaps the effective area and the ineffective area and includes at least one color filter pattern, and one end of the at least one color filter pattern is positioned on at least one side of the cutting line; forming a low refractive layer on the color filter layer, wherein the low refractive layer overlaps the effective area and the ineffective area and covers the one end of the at least one color filter pattern; forming a sealing member on the low refractive layer; and cutting the first base mother substrate, the color filter layer, and the low refractive layer along the cutting line.

In one or more embodiments, the forming of the color filter layer may include forming a first color filter pattern on the first base mother substrate, forming a second color filter pattern on the first color filter pattern, and forming a third color filter pattern on the second color filter pattern.

In one or more embodiments, in the forming of the third color filter pattern, a one end of the third color filter pattern may be disposed on the at least one side of the cutting line.

In one or more embodiments, the one end of the third color filter pattern may be spaced apart from the at least one side of the cutting line by about 44.5 micrometers or less.

In one or more embodiments, in the forming of the second color filter pattern, a one end of the second color filter pattern may be positioned adjacent to the at least one side of the cutting line, and the one end of the second color filter pattern may be formed to protrude from the one end of the third color filter pattern.

In one or more embodiments, the one end of the second color filter pattern may be spaced apart from the at least one side of the cutting line by about 50 micrometers or less.

In one or more embodiments, the one end of the third color filter pattern may be spaced apart from the one end of the second color filter pattern by about 6 micrometers or less.

In one or more embodiments, after the forming of the color filter layer, the method may further include forming trenches in the color filter layer.

In one or more embodiments, the trenches may overlap the sealing member.

In one or more embodiments, forming the low refractive layer may include filling a portion of the low refractive layer in the trenches.

In one or more embodiments, the trenches may overlap the sealing member and the ineffective area.

In a display device according to one or more embodiments of the present disclosure, as the thickness of the low refractive layer increases from an outside to an inside of the display device in at least a portion thereof, an intrusion of external materials through the low refractive layer may be prevented or reduced. As a result, defects of the display device are prevented or reduced, and the reliability of the display device may be improved.

In the method of manufacturing the display device according to one or more embodiments of the present disclosure, when the color conversion substrate is formed, one end of the at least one color filter pattern is positioned on at least one side of the cutting line, so that the side surface of the low refractive layer is not exposed or is exposed by about 0.7 micrometers or less. Accordingly, the thickness of the exposed side surface of the low refractive layer may be reduced due to a leveling phenomenon of the low refractive layer. The intrusion of external materials through the low refractive layer may be prevented or reduced. As a result, defects of the display device are prevented or reduced, and the reliability of the display device may be improved.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and, together with the description, serve to explain principles of the present disclosure. Above and/or other aspects of the present disclosure will become apparent and appreciated from the following description of embodiments taken in conjunction with the accompanying drawings. In the drawings.

DETAILED DESCRIPTION

Figure 1:
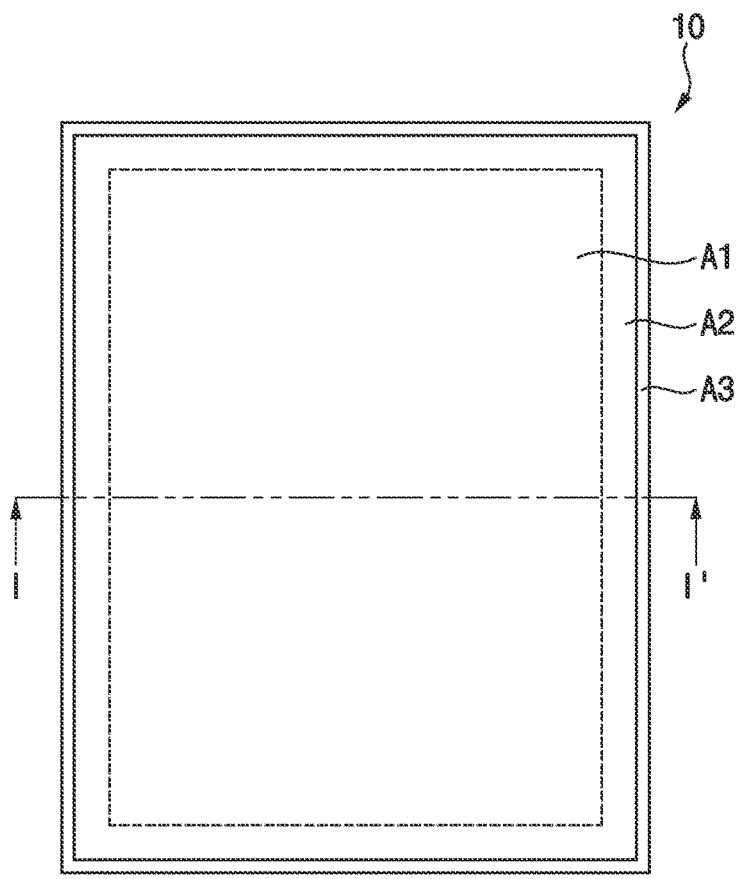
FIG. 1 is a plan view illustrating a display device according to one or more embodiments of the present disclosure.

The present disclosure may be modified in many alternate forms, and thus specific embodiments will be exemplified in the drawing and described in more detail. It should be understood, however, that it is not intended to limit the present disclosure to the particular forms disclosed, but rather, is intended to cover all modifications, equivalents, and alternatives falling within the spirit and scope of the present disclosure.

Hereinafter, display devices in accordance with one or more embodiments will be described in more detail with reference to the accompanying drawings. The same reference numerals are utilized for the same components in the drawings, and redundant descriptions of the same components will not be provided for conciseness.

In the drawings, the dimensions of structures may be exaggerated for clarity of illustration. It will be understood that, although the terms first, second, etc. may be utilized herein to describe one or more suitable elements, these elements should not be limited by these terms. These terms are only utilized to distinguish one element from another element. Thus, a first element could be termed a second element without departing from the teachings of the present disclosure. Similarly, a second element could be termed a first element. As utilized herein, the singular forms are intended to include the plural forms as well, unless the context clearly indicates otherwise.

In the present disclosure, it will be further understood that the terms "comprise(s)/include(s)" and/or "comprising/including" when utilized in this specification, specify the presence of stated features, numerals, steps, operations, elements, parts, or the combination thereof, but do not preclude the presence or addition of one or more other features, numerals, steps, operations, elements, parts, or the combination thereof. As used herein, the terms "and," "or," and "and/or" may include any and all combinations of one or more of the associated listed items. Expressions such as "at least one of," "one of," and "selected from," when preceding a list of elements, modify the entire list of elements and do not modify the individual elements of the list. For example, "at least one of a, b or c", "at least one selected from a, b, and c", "at least one selected from among a to c", etc., may indicate only a, only b, only c, both (e.g., simultaneously) a and b, both (e.g., simultaneously) a and c, both (e.g., simultaneously) b and c, all of a, b, and c, or variations thereof. Further, the use of "may" when describing embodiments of the present invention refers to "one or more embodiments of the present disclosure."

In the present disclosure, when a layer, a film, a region, a plate, etc. is referred to as being "on" or "above" another part, it can be "directly on" the other part, or intervening layers may also be present. In contrast, when a layer, a film, a region, a plate, etc. is referred to as being "under" or "below" another part, it can be "directly under" the other part, or intervening layers may also be present. Also, when an element is referred to as being disposed "on" another element, it can be disposed under the other element.

Figure 2:
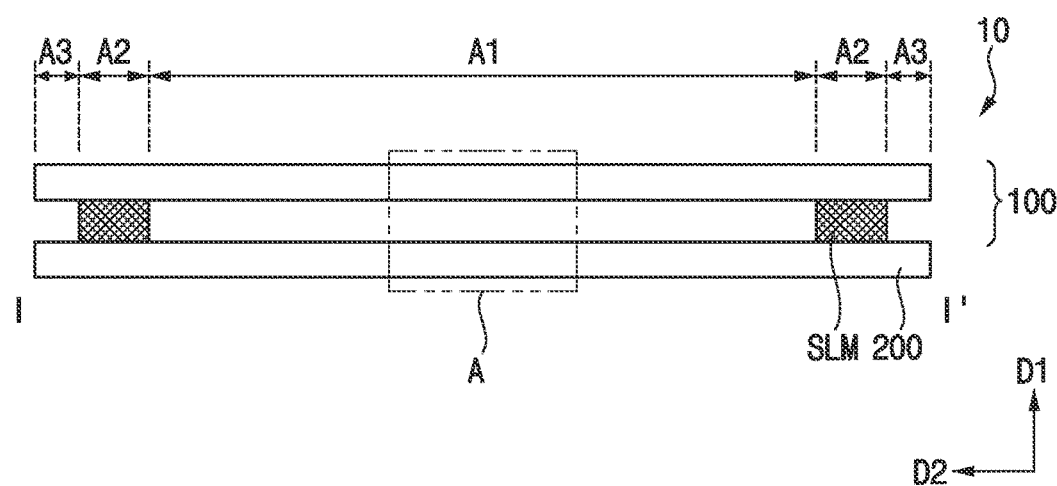
FIG. 2 is a cross-sectional view taken along line I-I' of FIG. 1.

FIG. 1 is a plan view illustrating a display device according to one or more embodiments of the present disclosure. FIG. 2 is a cross-sectional view taken along line I-I' of FIG. 1.

Referring to FIGS. 1 and 2, a display device 10 may include a color conversion substrate 100 and an array substrate 200. The color conversion substrate 100 may face the array substrate 200. The color conversion substrate 100 may be positioned in a first direction D1 from (e.g., may be on) the array substrate 200. For example, the first direction D1 may be a front direction of the display device 10 from the array substrate 200.

In one or more embodiments, the color conversion substrate 100 may include a sealing member SLM. The sealing member SLM may be disposed between the array substrate 200 and the color conversion substrate 100. The sealing member SLM may couple the array substrate 200 and the color conversion substrate 100 to each other.

The display device 10 may include a first area A1 in which an image is displayed, a second area A2 around (e.g., surrounding) the first area A1, and a third area A3 around (e.g., surrounding) the second area A2. For example, the first area A1 may be a display area, and the second area A2 and the third area A3 may be a non-display area. For example, in some embodiments, the second area A2 may be a sealing area, and the third area A3 may be an outer area.

Figure 3:
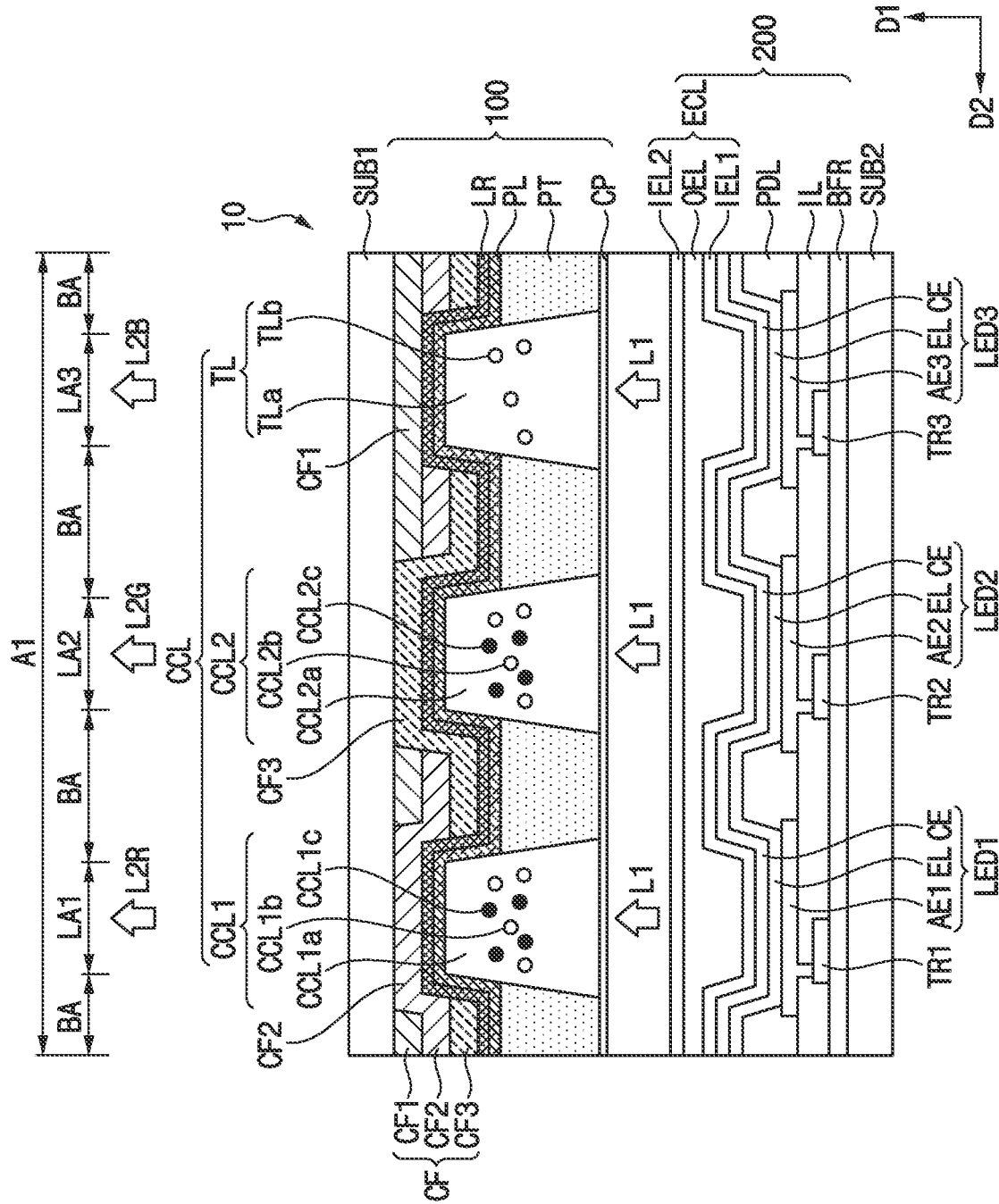
FIG. 3 is an enlarged cross-sectional view of area A of FIG. 2.

The color conversion substrate 100 may include a color conversion layer (e.g., the color conversion layer CCL of FIG. 3). The color conversion layer may be disposed in the first area A1 and may convert a wavelength of light generated from a light emitting element of the array substrate 200. The color conversion substrate 100 may further include a color filter layer that transmits light of a specific color.

The array substrate 200 may include a plurality of pixels and may be referred to as a display substrate. The pixels may be disposed in the first area A1 of the array substrate 200. Each of the pixels may include a driving element and a light emitting element. The driving element may include at least one thin film transistor. The light emitting element may generate light according to a driving signal. For example, the light emitting element may be an inorganic light emitting diode or an organic light emitting diode.

The sealing member SLM may be disposed between the array substrate 200 and the color conversion substrate 100, and may be disposed in the second area A2. For example, in one or more embodiments, the sealing member SLM may be disposed in the second area A2 between the array substrate 200 and the color conversion substrate 100 to surround the first area A1 in a plan view.

For example, in one or more embodiments, the sealing member SLM may have a planar shape of a hollow quadrangle. However, embodiments of the present disclosure are not limited thereto, for example, in some embodiments, the sealing member SLM may have one or more suitable planar shapes depending on the planar shape of the array substrate 200 or the color conversion substrate 100. For example, when the array substrate 200 or the color conversion substrate 100 has a planar shape such as a triangle, a rhombus, a polygon, a circle, or an oval, the sealing member SLM may have a planar shape such as a hollow triangle, a hollow rhombus, a hollow polygon, a hollow circle, or a hollow oval.

A filling layer may be disposed between the array substrate 200 and the color conversion substrate 100. For example, in one or more embodiments, the filling layer may act as a buffer against external pressure applied to the display device 10. For example, in some embodiments, the filling layer may maintain a gap between the array substrate 200 and the color conversion substrate 100. However, embodiments of the present disclosure are not limited thereto.

FIG. 3 is an enlarged cross-sectional view of area A of FIG. 2.

Referring to FIGS. 1 to 3, the first area A1 may include a light emitting area and a light blocking area BA. Light L1 generated by the array substrate 200 and incident to the color conversion substrate 100 (hereinafter, incident light) may be emitted to the outside through the light emitting area. The light emitting area may include first to third light emitting areas LA1, LA2, and LA3 for emitting light of different colors. For example, in one or more embodiments, a first transmitted light L2R having a red color may be emitted from the first emission area LA1, a second transmitted light L2G having a green color may be emitted from the second emission area LA2, and a third transmitted light L2B having a blue color may be emitted from the third emission area LA3.

In one or more embodiments, the first to third light emitting areas LA1, LA2, and LA3 may be spaced apart from each other in the plan view and arranged to repeat each other. The light blocking area BA may around (e.g., surround) the first to third light emitting areas LA1, LA2, and LA3 in the plan view. For example, in some embodiments, the light blocking area BA may have a grid shape in the plan view.

In one or more embodiments, the color conversion substrate 100 may include the sealing member SLM, a first base substrate SUB1, a color filter layer CF, a partition structure PT, a color conversion layer CCL, a low refractive layer LR, a protective layer PL, and a capping layer CP.

As the display device 10 includes the first area A1, the second area A2, and the third area A3, the first base substrate SUB1 may include the first area A1, the second area A2, and the third area A3.

The first base substrate SUB1 may be an insulating substrate formed of a transparent material. The first base substrate SUB1 may include glass or plastic.

The color filter layer CF may be disposed under the first base substrate SUB1 and may be disposed on the sealing member SLM. For example, in one or more embodiments, the color filter layer CF may be disposed under the first base substrate SUB1 and may overlap the first area A1, the second area A2, and the third area A3. The color filter layer CF may include a first color filter pattern CF1, a second color filter pattern CF2, and a third color filter pattern CF3.

The first color filter pattern CF1 may overlap the third light emitting area LA3 and may selectively transmit blue light. The second color filter pattern CF2 may overlap the first emission area LA1 and may selectively transmit red light. The third color filter pattern CF3 may overlap the second light emitting area LA2 and may selectively transmit green light.

In one or more embodiments, each of the first color filter pattern CF1, the second color filter pattern CF2, and the third color filter pattern CF3 may be disposed to further overlap the light blocking area BA. For example, as shown in FIG. 3, the second color filter pattern CF2 may overlap the first light emitting area LA1 and the light-blocking area BA, but may not overlap the second and third light emitting areas LA2, LA3. The third color filter pattern CF3 may overlap the second light emitting area LA2 and the light-blocking area BA, but may not overlap the first and third light emitting areas LA1 and LA3. The first color filter pattern CF1 may overlap the third light emitting area LA3 and the light-blocking area BA, but may not overlap the first and second light emitting areas LA1 and LA2. Under such an arrangement, in the light blocking area BA, portions of the first, second, and third color filter patterns CF1, CF2, and CF3 may overlap each other in the first direction D1. As a result, color mixing between the adjacent first to third light emitting areas LA1, LA2, and LA3 may be prevented or reduced.

The color filter layer CF may be disposed under the first base substrate SUB1 and may selectively further overlap the second area A2 and the third area A3. For example, in one or more embodiments, the color filter layer CF may extend from the first area A1 to the second area A2 and the third area A3.

A portion of the color filter layer CF overlapping the second area A2 and the third area A3 may serve as a light blocking member. In the second area A2 and the third area A3, the third color filter pattern CF3, the second color filter pattern CF2, and the first color filter pattern CF1 may be disposed to overlap each other in the direction D1. As such, in the second area A2 and the third area A3, the color filter layer CF may effectively block or reduce light traveling in the first direction D1.

For example, in one or more embodiments, in the second area A2 and the third area A3, the first color filter pattern CF1 may be disposed under the first base substrate SUB1, and the second color filter pattern CF2 may be disposed under the first color filter pattern CF1, and the third color filter pattern CF3 may be disposed under the second color filter pattern CF2. However, the arrangement order in embodiments of the present disclosure is not limited thereto.

In the second area A2 and the third area A3, the color filter layer CF may prevent a circuit structure such as wirings and a driving circuit disposed in the second area A2 of the color conversion substrate 100 from being visually recognized from the outside of the display device 10. In addition, the color filter layer CF may prevent or reduce a light leakage phenomenon in which light reflected from the circuit structure or light emitted from the first area A1 is emitted through the second area A2 and the third area A3 of the first base substrate SUB1.

The partition structure PT may be disposed in the first area A1 under the color filter layer CF. A plurality of openings may be formed in the partition structure PT. For example, as shown in FIG. 3, the openings of the partition structure PT may expose the first to third light emitting areas LA1, LA2, and LA3, separately. The partition structure PT may form a space for accommodating the ink composition in the process of forming the color conversion layer CCL. For example, in some embodiments, the partition structure PT may entirely overlap the light blocking area BA and may have a grid shape in the plan view.

In one or more embodiments, the partition structure PT may include an organic material. In one or more embodiments, the partition structure PT may further include a light blocking material. For example, in some embodiments, at least a portion of the partition structure PT may include a light blocking material such as a black pigment, a dye, or carbon black.

In one or more embodiments, the low refractive layer LR may be disposed under the color filter layer CF and may be disposed on the sealing member SLM. The low refractive layer LR may overlap the first area A1, the second area A2, and the third area A3.

The low refractive layer LR may have a lower refractive index than the color conversion layer CCL. The low refractive layer LR may improve light extraction efficiency to increase luminance and lifetime of the display device 10.

In one or more embodiments, the low refractive layer LR may include an organic material.

The protective layer PL may be disposed under the low refractive layer LR. For example, the protective layer PL may cover the low refractive layer LR. The protective layer PL may be entirely disposed in the first area A1, the second area A2, and the third area A3.

In one or more embodiments, the protective layer PL may include an inorganic material.

The color conversion layer CCL may be disposed under the protective layer PL and may overlap the first area A1. The color conversion layer CCL may include color conversion parts disposed on a bottom surface of the protective layer PL to be spaced apart from each other. In one or more embodiments, the color conversion layer CCL may include a first color conversion part CCL1, a second color conversion part CCL2, and a transmission part TL. The first color conversion part CCL1, the second color conversion part CCL2, and the transmission part TL may be disposed in the first area A1 under the color filter layer CF, and may overlap the first to third light emitting areas LA1, LA2, and LA3, respectively. For example, the first color conversion part CCL1, the second color conversion part CCL2, and the transmission part TL may be respectively disposed in the openings of the partition structure PT.

The first color conversion part CCL1 may overlap the first light emitting area LA1. The first color conversion part CCL1 may convert the incident light L1 into the first transmitted light L2R having a red color. For example, in one or more embodiments, the first color conversion part CCL1 may include a resin part CCL1*a*, a scatterer CCL1*b*, and a wavelength conversion particle CCL1*c*.

The scatterer CCL1*b* may scatter the incident light L1 to increase a light path without substantially changing the wavelength of the incident light L1 incident on the first color conversion part CCL1. The scatterer CCL1*b* may include a metal oxide or an organic material. In some embodiments, the scatterer CCL1*b* may not be provided.

In one or more embodiments, the wavelength conversion particle CCL1*c* may include quantum dots. The quantum dots may be defined as semiconductor materials having nanocrystals. The quantum dots have a specific bandgap depending on the composition and size. Accordingly, the quantum dots may be to absorb the incident light L1 and emit light having a wavelength different from that of the incident light L1. For example, the quantum dots may have a diameter of about 100 nm or less, specifically, a diameter of about 1 nm to about 20 nm. For example, in some embodiments, the wavelength conversion particle CCL1c of the first color conversion part CCL1 may include quantum dots that absorb the incident light L1 and emit red light.

The scatterer CCL1b and the wavelength conversion particle CCL1c may be disposed in the resin part CCL1a. For example, in some embodiments, the resin part CCL1a may include an epoxy-based resin, an acrylic resin, a phenol-based resin, a melamine-based resin, a cardo-based resin, and/or an imide-based resin.

The first color conversion part CCL1 may convert the incident light L1 to emit the first transmitted light L2R having a red color. The incident light L1 that is not converted by the first color conversion part CCL1 may be blocked by the second color filter pattern CF2. Consequently, in the first light emitting area LA1, the first transmitted light L2R having a red color may pass through the first base substrate SUB1 and be emitted to the outside (i.e., in the first direction D1).

The second color conversion part CCL2 may overlap the second light emitting area LA2. The second color conversion part CCL2 may convert the incident light L1 into a second transmitted light L2G having a green color. For example, in some embodiments, the second color conversion part CCL2 may include a resin part CCL2a, a scatterer CCL2b, and a wavelength conversion particle CCL2c. The resin part CCL2a and the scatterer CCL2b of the second color conversion part CCL2 may be substantially the same as or similar to the resin part CCL1a and the scatterer CCL1b of the first color conversion part CCL1.

For example, in some embodiments, the wavelength conversion particle CCL2c of the second color conversion part CCL2 may include quantum dots that absorb the incident light L1 and emit green light. Accordingly, the second color conversion part CCL2 may convert the incident light L1 to emit the second transmitted light L2G having a green color. The incident light L1 that is not converted by the second color conversion part CCL2 may be blocked by the third color filter pattern CF3. As a result, in the second light emitting area LA2, the second transmitted light L2G having green color may pass through the first base substrate SUB1 and be emitted to the outside (i.e., in the first direction D1).

The transmission part TL may overlap the third light emitting area LA3. The transmission part TL may be to transmit the incident light L1 to emit the third transmitted light L2B. For example, in some embodiments, the transmission part TL may include a resin part TLa and a scatterer TLb. The resin part TLa and the scatterer TLb of the transmission part TL may be substantially the same as or similar to the resin part CCL1a and the scatterer CCL1b of the first color conversion part CCL1.

However, embodiments of the present disclosure are not limited thereto, for example, in one or more embodiments, the transmission part TL may convert the incident light L1 into the third transmitted light L2B having a blue color. In this case, the transmission part TL may further include wavelength conversion particles including quantum dots that absorb the incident light L1 and emit blue light.

A portion of the incident light L1 may be blocked by the first color filter pattern CF1. Accordingly, in the third light emitting area LA3, the third transmitted light L2B having a blue color may pass through the first base substrate SUB1 and be emitted to the outside (i.e., in the first direction D1).

In the first to third light emitting areas LA1, LA2, and LA3, as the first to third transmitted lights L2R, L2G, and L2B emitted to the outside through the first base substrate SUB1 are combined, an image may be displayed in the first area A1.

The capping layer CP may be disposed under the protective layer PL. The capping layer CP may protect the color conversion layer CCL from oxygen, moisture, foreign substances, and/or the like. The capping layer CP may be entirely disposed in the first area A1, the second area A2, and the third area A3. For example, in one or more embodiments, the capping layer CP may cover the color filter layer CF, the low refractive layer LR, the protective layer PL, the partition structure PT, and the color conversion layer CCL.

In one or more embodiments, the array substrate 200 may include a second base substrate SUB2, a buffer layer BFR, first to third driving elements TR1, TR2, TR3, an insulation layer IL, and a pixel defining layer PDL, first to third light emitting elements LED1, LED2, and LED3, and an encapsulation layer ECL.

The second base substrate SUB2 may face the first base substrate SUB1. As the display device 10 includes the first area A1, the second area A2, and the third area A3, the second base substrate SUB2 may include the first area A1, the second area A2, and the third area A3.

The second base substrate SUB2 may be an insulating substrate formed of a transparent or opaque material. In some embodiments, the second base substrate SUB2 may include glass. In this scenario, the array substrate 200 may be a rigid display substrate. In some embodiments, the second base substrate SUB2 may include plastic. In this scenario, the array substrate 200 may be a flexible display substrate.

The buffer layer BFR may be disposed on the second base substrate SUB2. The buffer layer BFR may prevent or reduce impurities such as oxygen and moisture from diffusing onto the second base substrate SUB2 through the second base substrate SUB2. The buffer layer BFR may include an inorganic material such as a silicon compound or a metal oxide. The buffer layer BFR may have a single-layer structure or a multi-layer structure including a plurality of insulation layers.

The first to third driving elements TR1, TR2, and TR3 may be disposed in the first area A1 on the buffer layer BFR. Each of the first to third driving elements TR1, TR2, and TR3 may include at least one thin film transistor. A channel layer of the thin film transistor may include an oxide semiconductor, a silicon semiconductor, an organic semiconductor, and/or the like. For example, the oxide semiconductor may include at least one selected from among oxide of indium (In), oxide of gallium (Ga), oxide of tin (Sn), oxide of zirconium (Zr), oxide of vanadium (V), oxide of hafnium (Hf), oxide of cadmium (Cd), oxide of germanium (Ge), oxide of chromium (Cr), oxide of titanium (Ti), and/or oxide of zinc (Zn). The silicon semiconductor may include amorphous silicon, polycrystalline silicon, and/or the like.

The insulation layer IL may cover the first to third driving elements TR1, TR2, and TR3. The insulation layer IL may include a combination of an inorganic insulation layer and an organic insulation layer.

The first to third light emitting elements LED1, LED2, and LED3 may be disposed on the insulation layer IL. For example, in one or more embodiments, first to third pixel electrodes AE1, AE2, and AE3 may be disposed on the insulation layer IL. Each of the first to third pixel electrodes AE1, AE2, and AE3 may include a conductive material such as a metal, an alloy, a conductive metal nitride, a conductive metal oxide, or a transparent conductive material. Each of the first to third pixel electrodes AE1, AE2, and AE3 may have a single-layer structure or a multi-layer structure including a plurality of conductive layers.

The first to third pixel electrodes AE1, AE2, and AE3 may be electrically connected to the first to third driving elements TR1, TR2, and TR3 through contact holes formed in the insulation layer IL, respectively.

The pixel defining layer PDL may be disposed on the first to third pixel electrodes AE1, AE2, and AE3. The pixel defining layer PDL may include an organic material. The pixel defining layer PDL may define a pixel opening exposing at least a portion of each of the first to third pixel electrodes AE1, AE2, and AE3.

An emission layer EL may be disposed on the first to third pixel electrodes AE1, AE2, and AE3 exposed by the pixel opening of the pixel defining layer PDL. In one or more embodiments, the emission layer EL may extend continuously on the first area A1 across a plurality of pixels. In one or more embodiments, the emission layer EL may be separated from the emission layer of an adjacent pixel.

The emission layer EL may include at least one selected from among an organic light emitting material and quantum dots. In some embodiments, the emission layer EL may generate blue light. However, embodiments of the present disclosure are not limited thereto. In one or more embodiments, the emission layer EL may generate red light or green light, or may generate lights having different colors according to pixels.

For example, in one or more embodiments, all of the emission layers EL may include an organic material for emitting blue light. In these embodiments, the emission layer EL may be formed in multiple layers, and may have a structure in which a plurality of blue organic emission layers are stacked. For example, in some embodiments, the emission layer EL may have a structure in which three blue organic emission layers are stacked.

However, embodiments according to the present disclosure are not limited thereto, for example, in one or more embodiments, the emission layer EL may have a structure in which a plurality of blue organic emission layers and an organic emission layer emitting light of different colors are stacked. For example, in some embodiments, the emission layer EL may have a structure in which three blue organic emission layers and one green organic emission layer are stacked. In one or more embodiments, functional layers such as a hole injection layer, a hole transport layer, an electron transport layer, and/or an electron injection layer may be disposed on the upper and/or lower portions of the emission layer EL.

A common electrode CE may be disposed on the emission layer EL. The common electrode CE may include a conductive material such as a metal, an alloy, a conductive metal nitride, a conductive metal oxide, and/or a transparent conductive material. The common electrode CE may have a single-layer structure or a multi-layer structure including a plurality of conductive layers. In one or more embodiments, the common electrode CE may extend continuously on the first area A1 across a plurality of pixels.

The first pixel electrode AE1, the emission layer EL, and the common electrode CE may form the first light emitting element LED1, and the second pixel electrode AE2, the emission layer EL, and the common electrode CE may form the second light emitting element LED2, and the third pixel electrode AE3, the emission layer EL, and the common electrode CE may form the third light emitting element LED3.

The encapsulation layer ECL may be disposed on the common electrode CE. The encapsulation layer ECL may include at least one inorganic encapsulation layer and/or at least one organic encapsulation layer. In one or more embodiments, the encapsulation layer ECL may include a first inorganic encapsulation layer IEL1 disposed on the common electrode CE, an organic encapsulation layer OEL disposed on the first inorganic encapsulation layer IEL1, and a second inorganic encapsulation layer IEL2 disposed on the organic encapsulation layer OEL.

In one or more embodiments, a dam may be disposed in the second area A2 on the second base substrate SUB2. For example, in some embodiments, the dam may be around (e.g., surround) the first area A1 in the plan view. The dam may prevent or reduce an organic material from overflowing to the outside of the dam (e.g., in the second direction D2 in FIG. 3) during the formation of the organic encapsulation layer OEL.

Hereinafter, the color conversion substrate 100 will be further described with reference to FIGS. 4 to 6.

Figure 4:
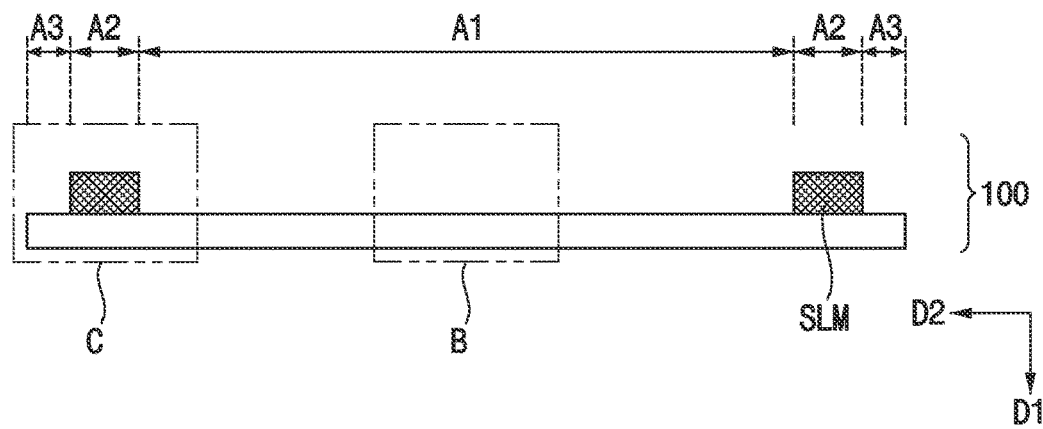
FIG. 4 is a cross-sectional view illustrating the color conversion substrate of FIG. 2.

FIG. 4 is a cross-sectional view illustrating the color conversion substrate of FIG. 2. FIG. 5 is an enlarged cross-sectional view of area B of FIG. 4. FIG. 6 is an enlarged cross-sectional view of area C of FIG. 4.

For example, FIG. 4 may be an inverted shape of the color conversion substrate 100 of FIG. 2. Accordingly, the first direction D1 may face downward.

Figure 5:
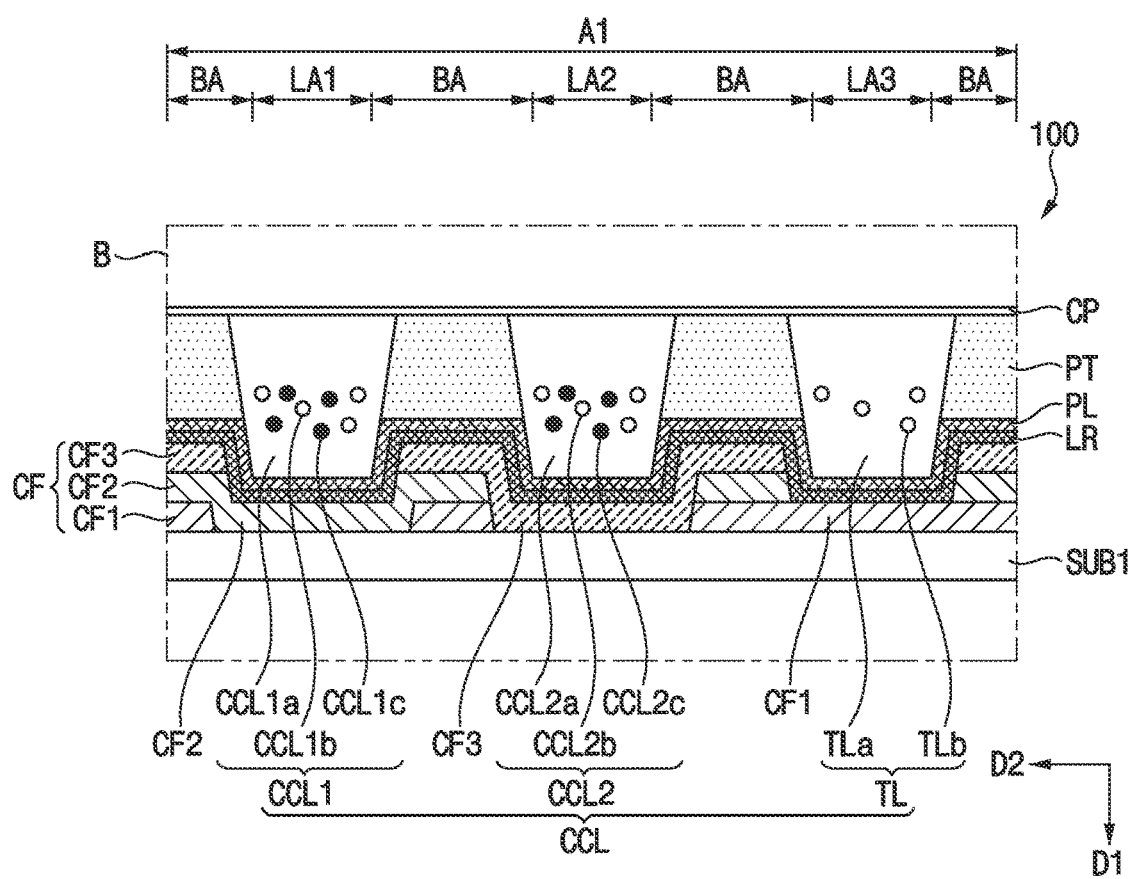
FIG. 5 is an enlarged cross-sectional view of area B of FIG. 4.
Figure 6:
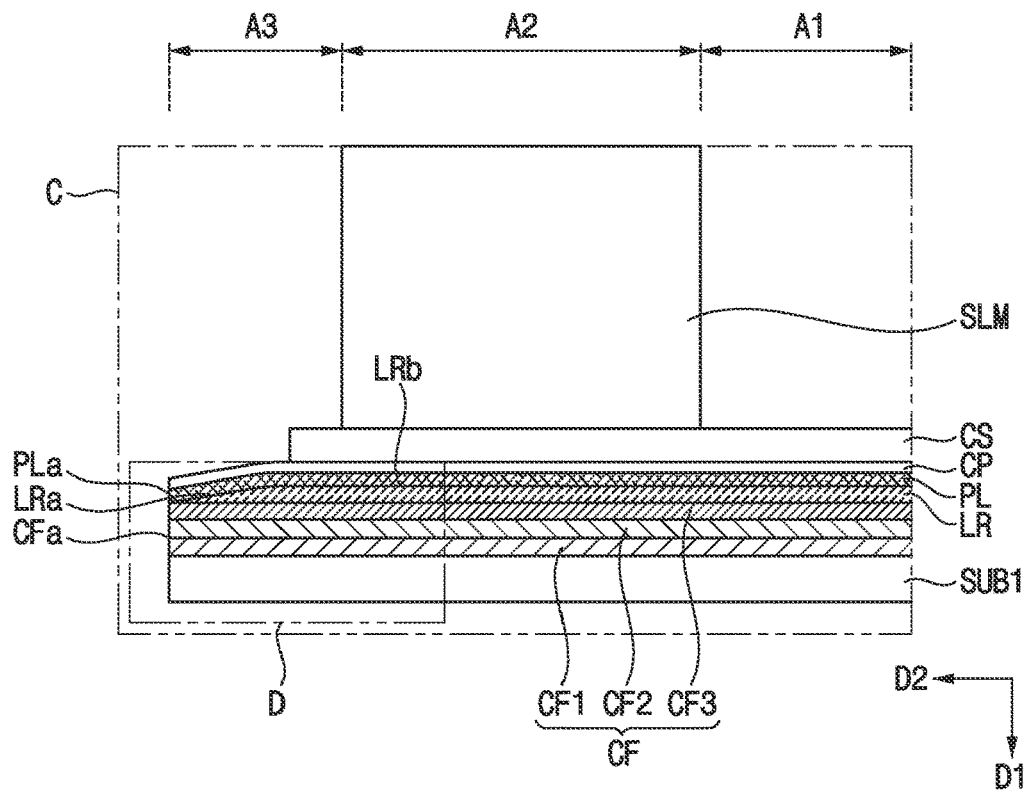
FIG. 6 is an enlarged cross-sectional view of area C of FIG. 4.

Referring further to FIGS. 4 to 6, the color conversion substrate 100 may include the first base substrate SUB1, the color filter layer CF, the partition structure PT, the color conversion layer CCL, the low refractive layer LR, the protective layer PL, the capping layer CP, a spacer CS, and the sealing member SLM.

The sealing member SLM may be disposed on the first base substrate SUB1 and may be disposed in the second area A2. The spacer CS may be disposed under the sealing member SLM and disposed on the capping layer CP. The spacer CS may support the sealing member SLM and may maintain a gap between the sealing member SLM and the capping layer CP.

The color filter layer CF may be disposed on the first base substrate SUB1 and may be disposed under the sealing member SLM. For example, in one or more embodiments, the first color filter pattern CF1 may be disposed on the first base substrate SUB1 in a direction opposite to the first direction D1, the second color filter pattern CF2 may be disposed on the first color filter pattern, and the third color filter pattern CF3 may be disposed on the second color filter pattern CF2.

The low refractive layer LR may be disposed on the color filter layer CF and may be disposed under the sealing member SLM. The low refractive layer LR may include an organic material.

In one or more embodiments, the low refractive layer LR may be disposed in the first area A1, the second area A2, and the third area A3. In at least one portion of the third area A3, the thickness of the low refractive layer LR may increase from the third area A3 to the second area A2. For example, in some embodiments, in at least a portion of the third area A3, the thickness of the low refractive layer LR may increase from the outside to the inside of the display device 10. As such, a portion of the low refractive layer LR that overlaps with the first area A1 and the second area A2 may have a larger thickness than a portion of the low refractive layer LR overlaps with the third area A3.

The protective layer PL may be disposed on the low refractive layer LR.

Figure 7:
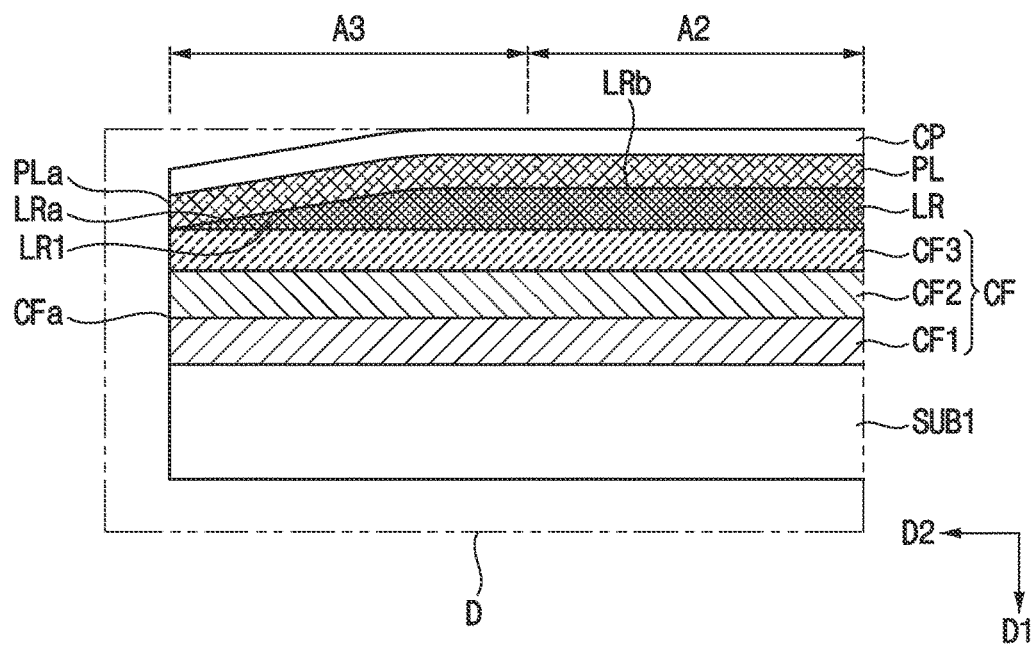
FIG. 7 is an enlarged cross-sectional view of area D of FIG. 6.

FIG. 7 is an enlarged cross-sectional view of area D of FIG. 6.

Referring further to FIG. 7, a side surface CFa of the color filter layer CF and a side surface PLa of the protective layer PL may be exposed to the outside. In one or more embodiments, the protective layer PL may cover one end LR1 of the low refractive layer LR. For example, in some embodiments, the protective layer PL may cover an upper surface LRb and a side surface LRa of the low refractive layer LR. For example, in certain embodiments, the low refractive layer LR may not be exposed to the outside.

In one or more embodiments, the low refractive layer LR is not exposed to the outside by the protective layer PL and the color filter layer CF, so that the display device 10 may prevent or reduce the intrusion of external materials through the low refractive layer LR. As a result, defects of the display device 10 are prevented or reduced, and a reliability of the display device 10 may be improved.

Figure 8:
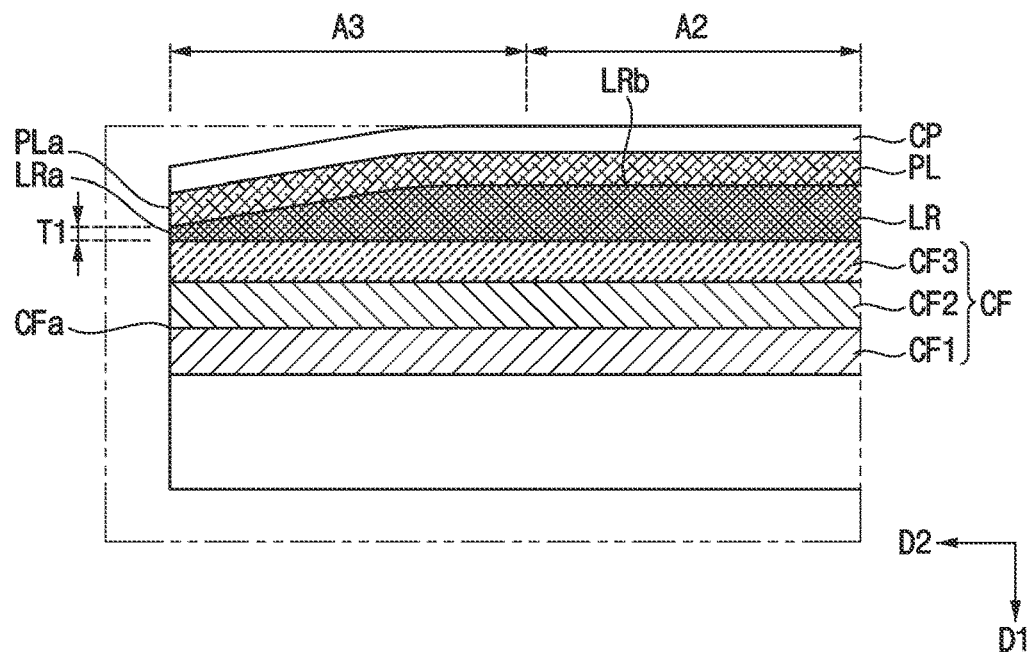
FIG. 8 is a cross-sectional view illustrating another example of FIG. 7.

FIG. 8 is a cross-sectional view illustrating another example of FIG. 7.

Referring to FIG. 8, in one or more embodiments, the protective layer PL may expose a side surface LRa of the low refractive layer LR. For example, in some embodiments, the protective layer PL may cover only the upper surface LRb of the low refractive layer LR and expose the side surface LRa of the low refractive layer LR.

In one or more embodiments, a thickness T1 of the exposed side surface LRa of the low refractive layer LR may be greater than 0 and less than or equal to about 0.7 micrometers. When the thickness T1 of the exposed side surface LRa of the low refractive layer LR is greater than about 0.7 micrometers, external materials may penetrate into the display device 10 through the low refractive layer LR. In this scenario, a defect may occur in the display device 10.

In one or more embodiments, as the thickness T1 of the exposed side surface LRa of the low refractive layer LR by the protective layer PL is greater than 0 and less than or equal to about 0.7 micrometers, the intrusion of external materials through the low refractive layer LR is prevented or reduced. As a result, defects of the display device 10 are prevented or reduced, and the reliability of the display device 10 may be improved.

For example, referring to FIGS. 7 and 8, in one or more embodiments, the protective layer PL covers the low refractive layer LR, and the thickness of the side surface LRa of the low refractive layer LR may be greater than 0 and less than or equal to about 0.7 micrometers.

Figure 9:
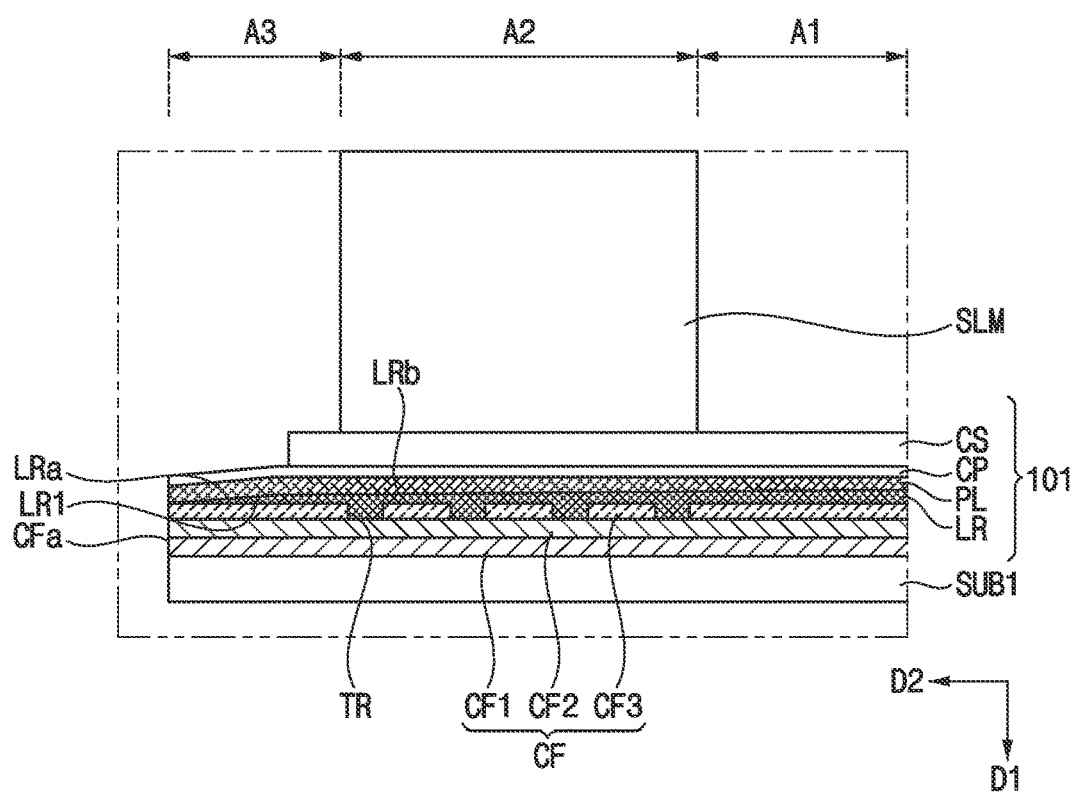
FIG. 9 is a cross-sectional view illustrating another example of FIG. 6.

FIG. 9 is a cross-sectional view illustrating another example of FIG. 6.

Referring to FIG. 9, in one or more embodiments, trenches TR may be defined in the color filter layer CF. The trenches TR may be disposed in the second area A2 and may overlap the sealing member SLM.

For example, in one or more embodiments, the trenches TR may be defined in the third color filter pattern CF3 included in the color filter layer CF. However, embodiments according to the present disclosure are not limited thereto, for example, in some embodiments, the trenches TR may also be selectively defined in the first color filter pattern CF1 and the second color filter pattern CF2.

A portion of the low refractive layer LR may be disposed to fill the inside of the trenches TR.

Accordingly, the thickness of the low refractive layer LR may be greater in the first area A1 and the second area A2 than in the third area A3. For example, in one or more embodiments, the thickness of the low refractive layer LR may increase from the third area A3 to the first area A1. However, embodiments of the present disclosure are not limited thereto.

In one or more embodiments, as the trenches TR are defined in the color filter layer CF, and a portion of the low refractive layer LR fills the inside of the trenches TR, the thickness of the one end LR1 of the low refractive layer LR may be reduced. The intrusion of external materials through the low refractive layer LR may be prevented or reduced. As such, defects of the display device 10 are prevented or reduced, and the reliability of the display device 10 may be improved.

Figure 10:
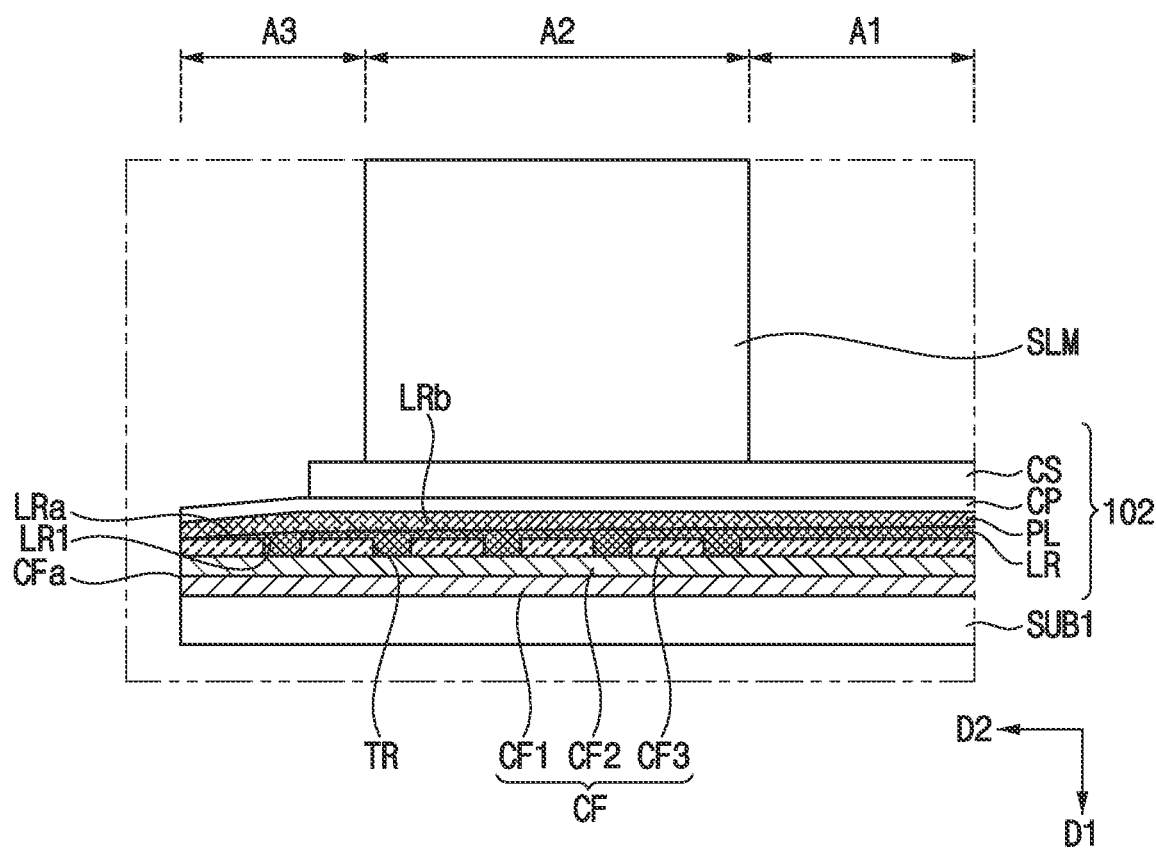
FIG. 10 is a cross-sectional view illustrating another example of FIG. 9.

FIG. 10 is a cross-sectional view illustrating another example of FIG. 9.

Referring to FIG. 10, in one or more embodiments, trenches TR may be defined in the color filter layer CF. The trenches TR may be disposed in the second area A2 and the third area A3. For example, in some embodiments, the trenches TR may be defined in the third color filter pattern CF3 included in the color filter layer CF.

Accordingly, the thickness of the low refractive layer LR may be greater in the first area A1 and the second area A2 than in the third area A3. For example, in some embodiments, the thickness of the low refractive layer LR may increase from the third area A3 to the first area A1. However, embodiments of the present disclosure are not limited thereto.

As more of the trenches TR are formed in the color filter layer CF, the thickness of the one end LR1 of the low refractive layer LR may be reduced. Consequently, the intrusion of external materials through the low refractive layer LR may be prevented or reduced.

FIGS. 11 to 23 are views illustrating a method of manufacturing a display device according to one or more embodiments of the present disclosure.

For example, in one or more embodiments, a method of manufacturing a display device described with reference to FIGS. 11 to 23 may be a method of manufacturing the display device 10 described with reference to FIGS. 1 to 8. Therefore, the overlapping description may not be provided herein for conciseness.

Figure 11:
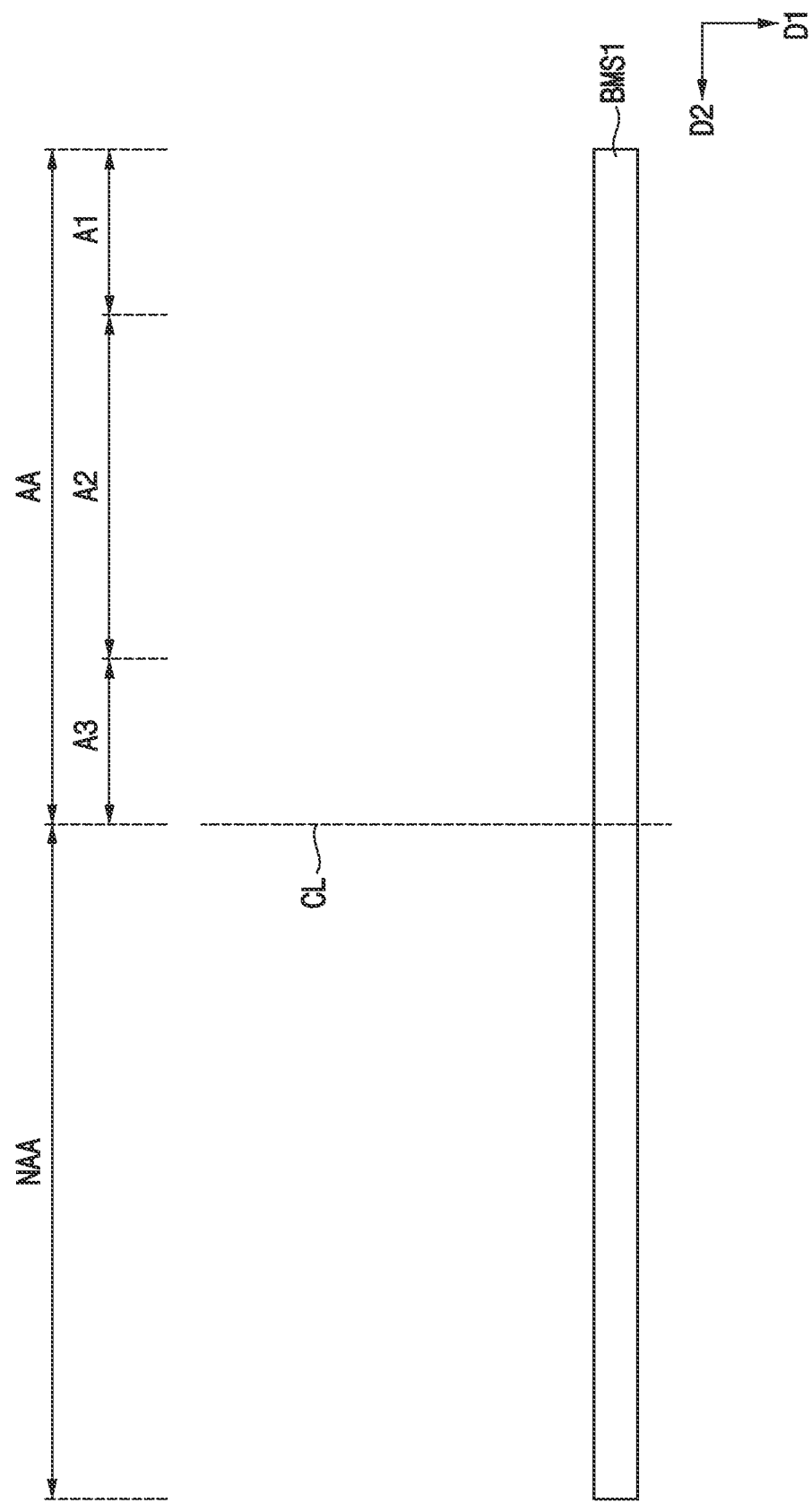
FIGS. 11-23 are views illustrating a method of manufacturing a display device according to one or more embodiments of the present disclosure.

Referring to FIG. 11, a first base mother substrate BMS1 may be formed. The first base mother substrate BMS1 may include an effective area AA and an ineffective area NAA around (e.g., surrounding) the effective area AA. A cutting line CL may be defined in a boundary between the effective area AA and the ineffective area NAA.

The effective area AA may be a portion remaining in a display device, and the ineffective area NAA may be a cut and removed portion. The effective area AA may include a first area A1, a second area A2 around (e.g., surrounding) the first area A1, and a third area A3 around (e.g., surrounding) the second area A2.

Figure 12:
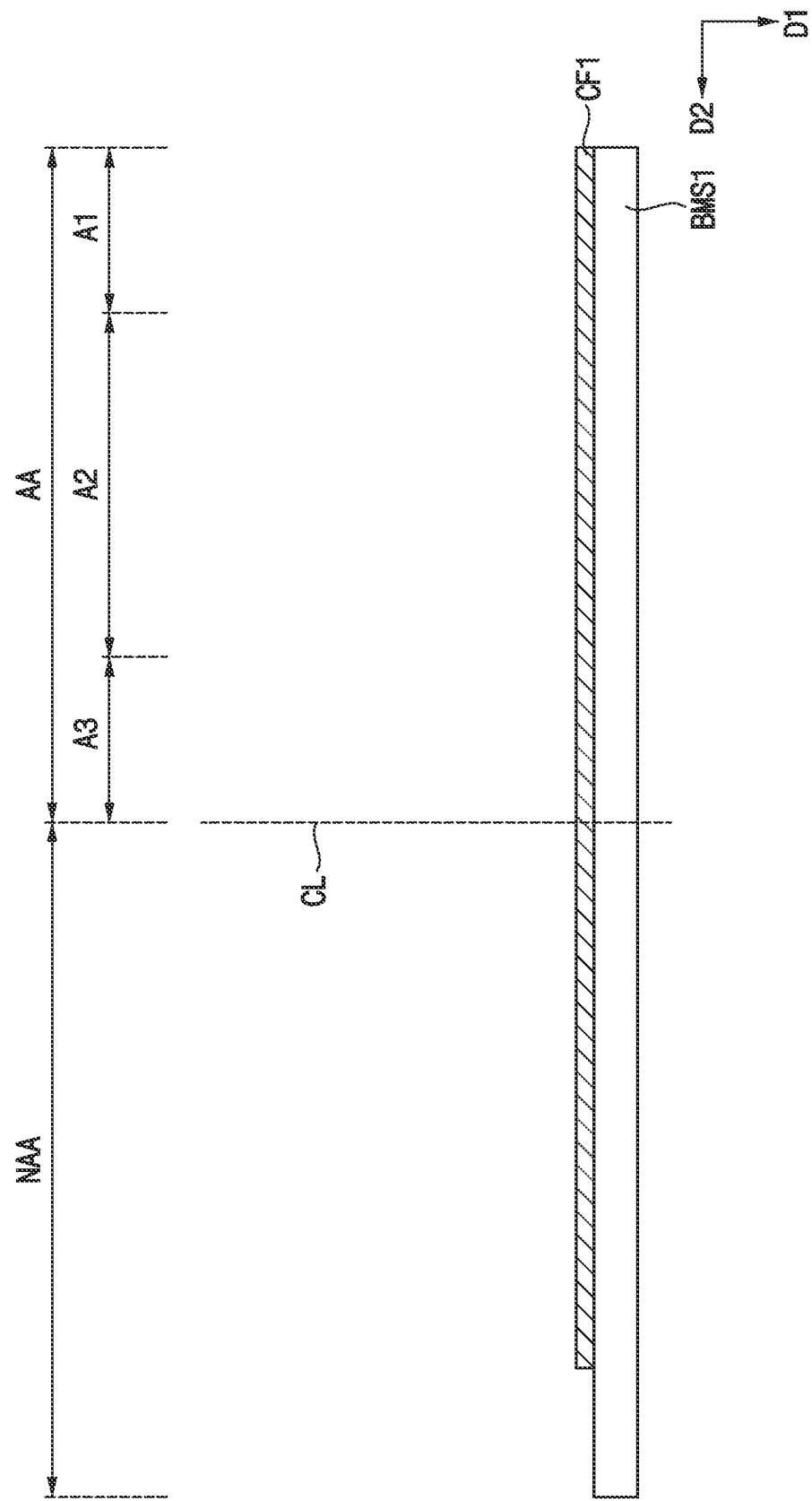
Figure 13:
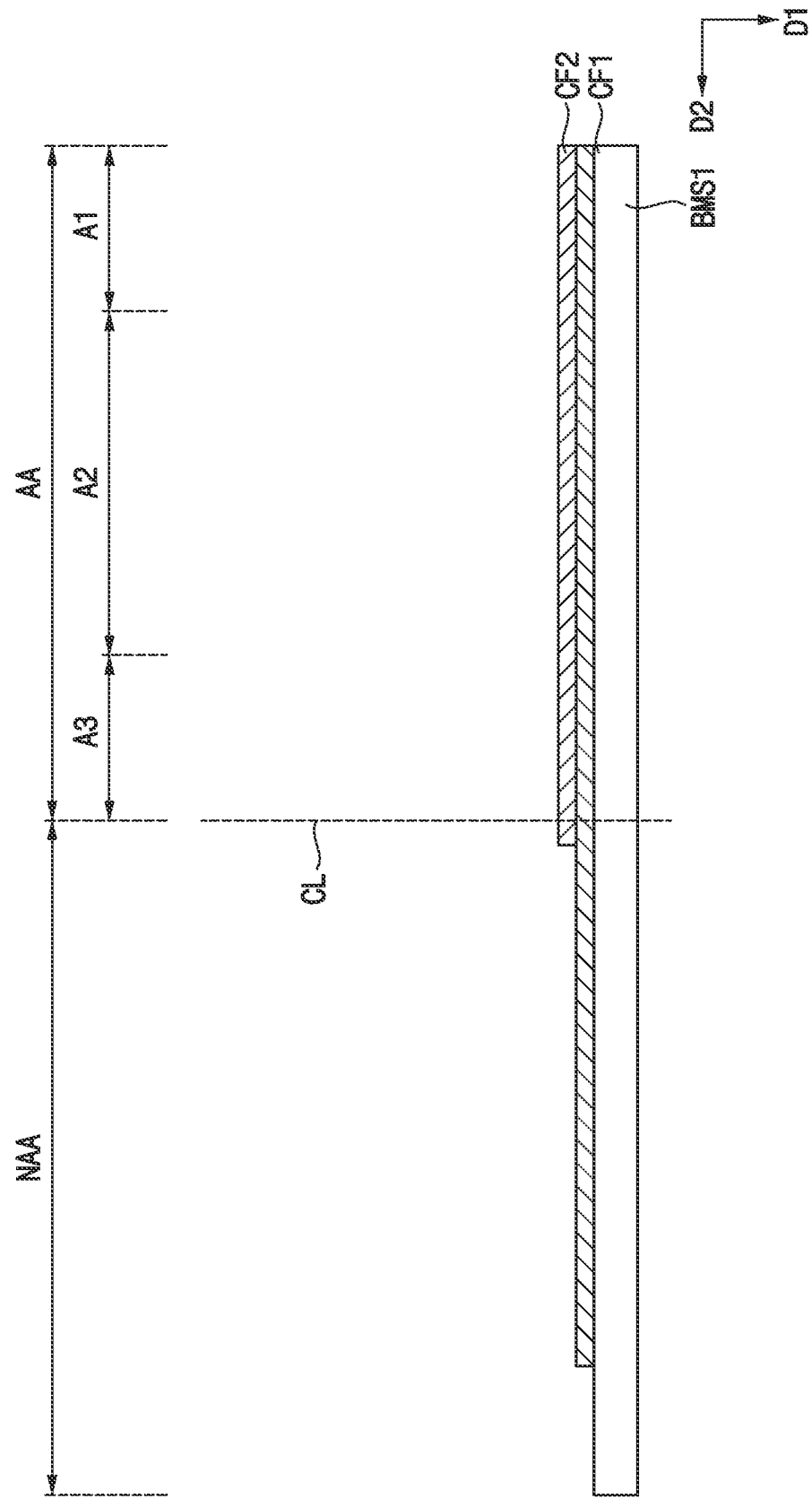
Figure 14:
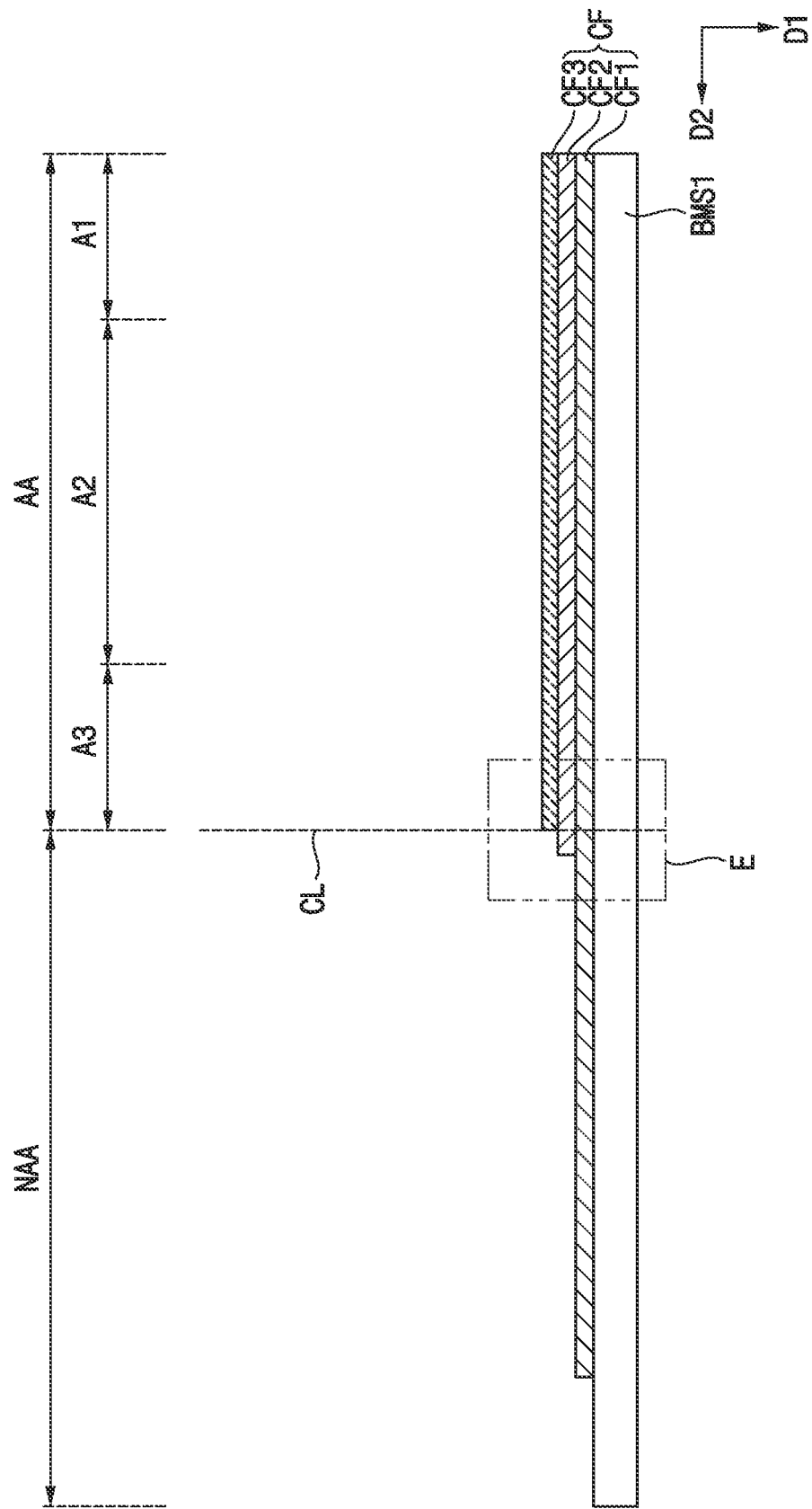

Referring to FIGS. 12 to 14, a color filter layer CF may be formed on the first base mother substrate BMS1. The color filter layer CF may overlap the effective area AA and the ineffective area NAA. The color filter layer CF may include at least one color filter pattern.

Referring to FIG. 12, a first color filter pattern CF1 may be formed on the first base mother substrate BMS1. Referring to FIG. 13, a second color filter pattern CF2 may be formed on the first color filter pattern CF1. Referring to FIG. 14, a third color filter pattern CF3 may be formed on the second color filter pattern CF2. The first to third color filter patterns CF1, CF2, and CF3 may form the color filter layer CF.

In one or more embodiments, the color filter layer CF may be formed such that one end of the at least one color filter pattern (e.g., at least one color filter pattern selected from among the first to third color filter patterns CF1, CF2, CF3) is positioned on at least one side of the cutting line CL. The third color filter pattern CF3 may be formed such that one end of the second color filter pattern CF2 protrudes from the third color filter pattern CF3. The second color filter pattern CF2 may be formed such that one end of the first color filter pattern CF1 protrudes from the second color filter pattern CF2.

Figure 15:
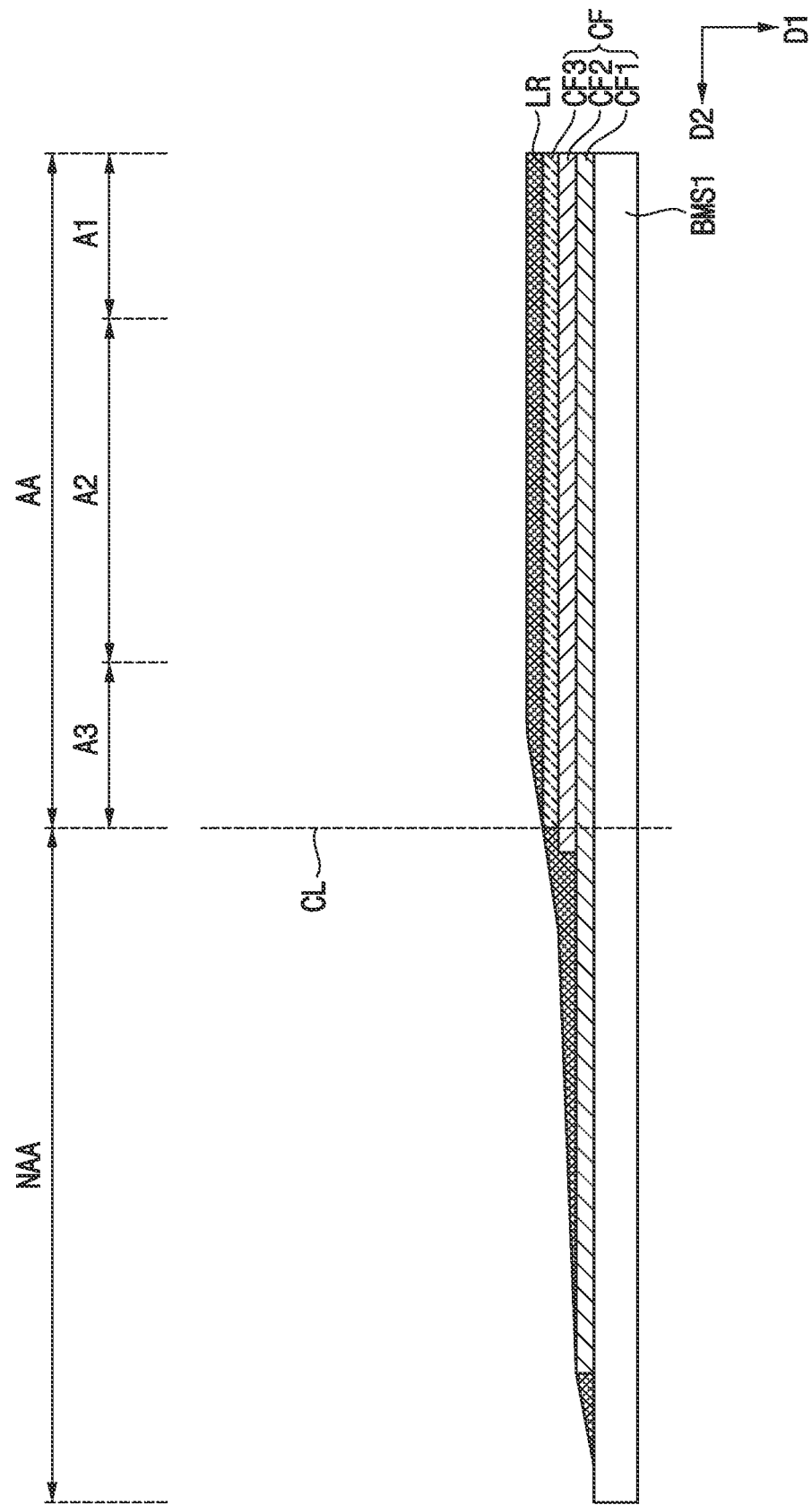

Referring further to FIG. 15, a low refractive layer LR may be formed on the color filter layer CF. The low refractive layer LR may be formed to overlap the effective area AA and the ineffective area NAA. The low refractive layer LR may cover the one end of the at least one color filter pattern.

The low refractive layer LR may be formed of an organic material. Because the low refractive layer LR is formed of the organic material, when the low refractive layer LR is formed, the low refractive layer LR may flow down (e.g., a leveling phenomenon of the low refractive layer LR). For example, in one or more embodiments, due to the leveling phenomenon of the low refractive layer LR, the low refractive layer LR may flow down from one end of the color filter layer CF.

Figure 16:
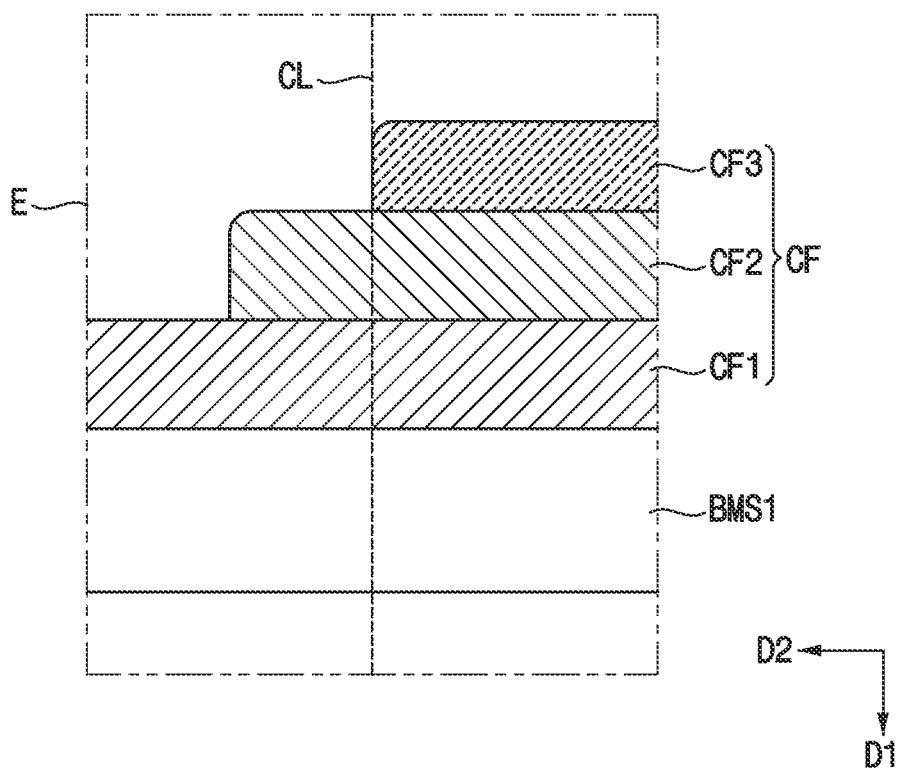

FIG. 16 is an enlarged cross-sectional view of area E of FIG. 14.

Referring to FIG. 16, for example, in one or more embodiments, the one end of the third color filter pattern CF3 may be positioned on the at least one side of the cutting line CL. For example, in some embodiments, the one end of the third color filter pattern CF3 may coincide with the cutting line CL. Also, the one end of the second color filter pattern CF2 may be adjacent to the cutting line CL. As such, a step may be formed by the third color filter pattern CF3 and the second color filter pattern CF2 near the cutting line CL. When the low refractive layer LR is formed, the low refractive layer LR may flow down near the cutting line CL (e.g., a leveling phenomenon) due to the step difference. Accordingly, a thickness of the low refractive layer LR positioned on the cutting line CL may be reduced.

Figure 17:
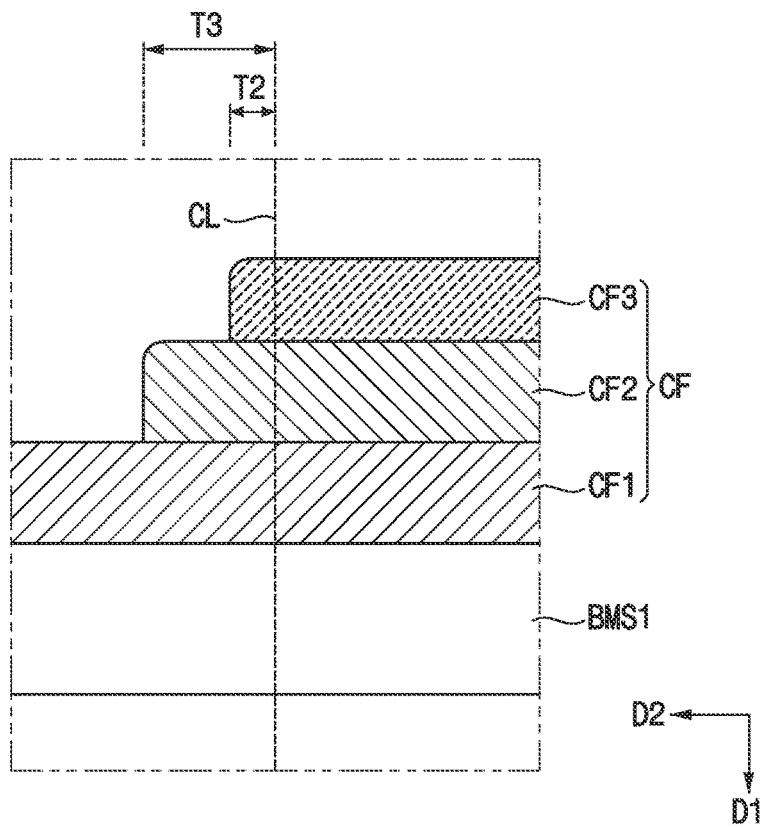

FIG. 17 is a cross-sectional view illustrating another example of FIG. 16.

Referring to FIG. 17, in one or more embodiments, the one end of the third color filter pattern CF3 may be spaced apart from the at least one side of the cutting line CL by about 44.5 micrometers or less. The one end of the second color filter pattern CF2 may be spaced apart from the at least one side of the cutting line CL by about 50 micrometers or less. For example, in some embodiments, a length T2 in the second direction D2 between the cutting line CL and the one end of the third color filter pattern CF3 may be about 44.5 micrometers or less. A length T3 in the second direction D2 between the cutting line CL and the one end of the second color filter pattern CF2 may be about 50 micrometers or less. Also, in these embodiments, the one end of the third color filter pattern CF3 may be formed inward than the one end of the second color filter pattern CF2.

When the one end of the third color filter pattern CF3 is spaced apart from the cutting line CL by more than about 44.5 micrometers, the leveling phenomenon of the low refractive layer LR due to the step formed by the third color filter pattern CF3 may decrease in the cutting line CL. Consequently, the thickness of the low refractive layer LR formed on the cutting line CL may increase.

When the one end of the second color filter pattern CF2 is spaced apart from the cutting line CL by more than about 50 micrometers, the leveling phenomenon of the low refractive layer LR due to the step formed by the second color filter pattern CF2 and the third color filter pattern CF3 may decrease in the cutting line CL. Consequently, the thickness of the low refractive layer LR formed on the cutting line CL may increase.

Figure 18:
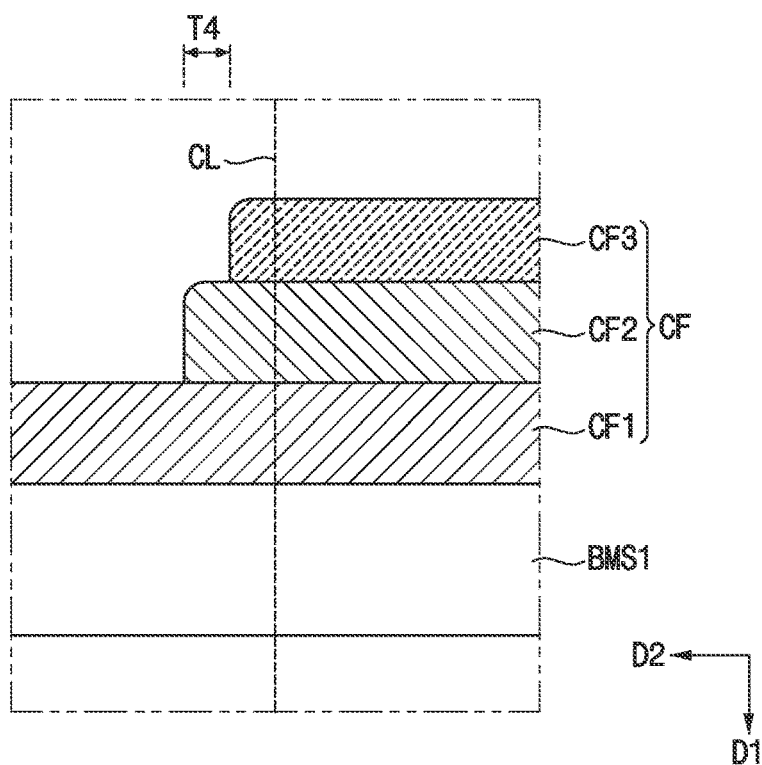

FIG. 18 is a cross-sectional view illustrating another example of FIG. 15.

Referring to FIG. 18, in one or more embodiments, the one end of the third color filter pattern CF3 may be formed to be spaced apart from the one end of the second color filter pattern CF2 by about 6 micrometers or less. For example, in some embodiments, a length T4 in the second direction D2 between the one end of the second color filter pattern CF2 and the one end of the third color filter pattern CF3 may be about 6 micrometers or less.

When the one end of the third color filter pattern CF3 is spaced apart from the one end of the second color filter pattern CF2 by less than about 6 micrometers, a slope of a step formed by the one end of the second color filter pattern CF2 and the one end of the third color filter pattern CF3 may increase. Consequently, the leveling phenomenon of the low refractive layer LR due to the step may increase in the cutting line CL. As a result, the thickness of the low refractive layer LR formed on the cutting line CL may be reduced.

Figure 19:
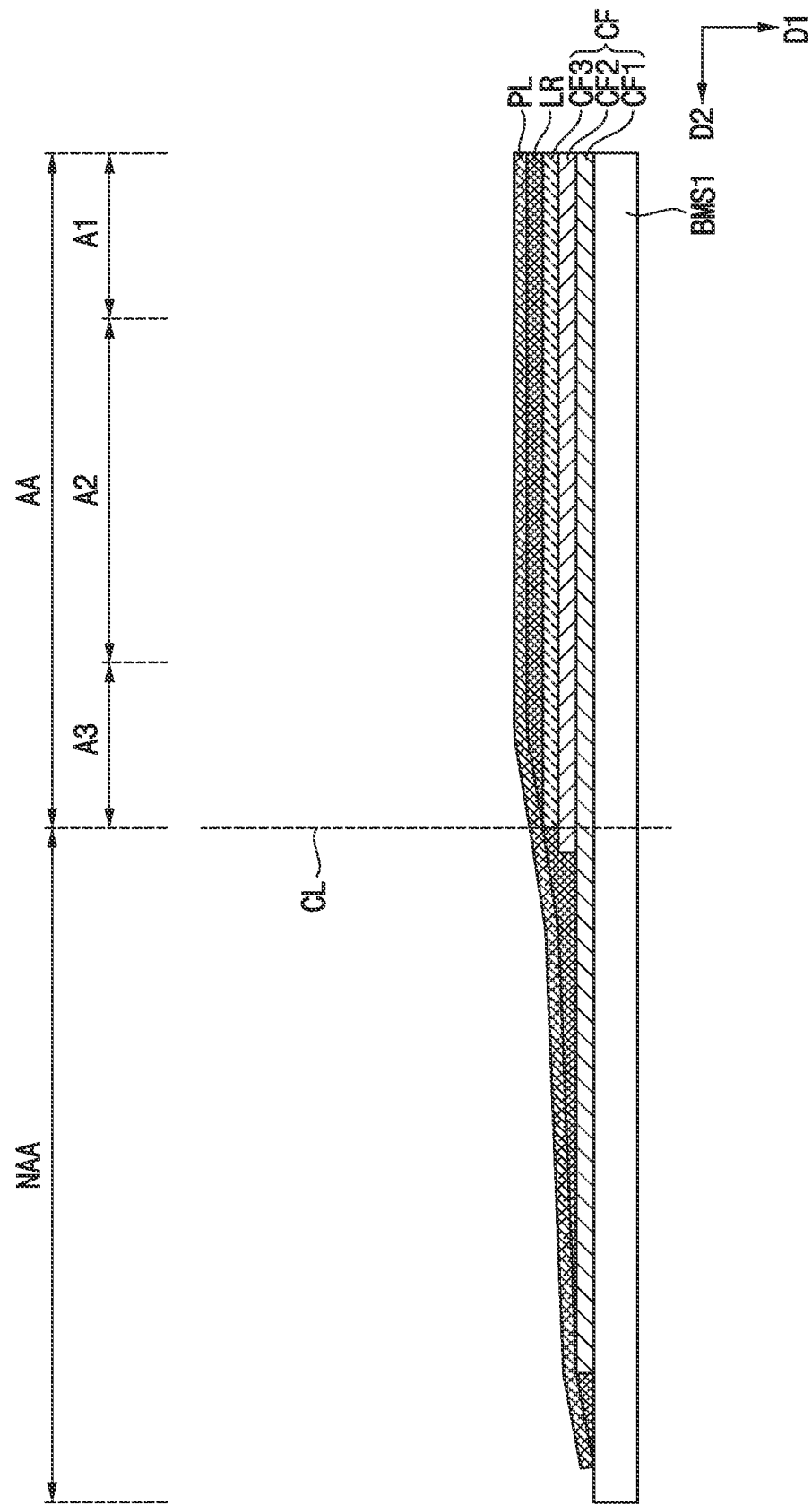

Referring to FIG. 19, a protective layer PL may be formed on the low refractive layer LR. The protective layer PL may overlap the effective area AA and the non-effective area NAA. The protective layer PL may cover the low refractive layer LR.

A partition structure (e.g., the partition structure PT of FIG. 4) may be formed in the first area A1 on the protective layer PL. A color conversion layer (e.g., the color conversion layer CCL of FIG. 4) may be formed between the partition structure in the first area A1 on the protective layer PL.

Figure 20:
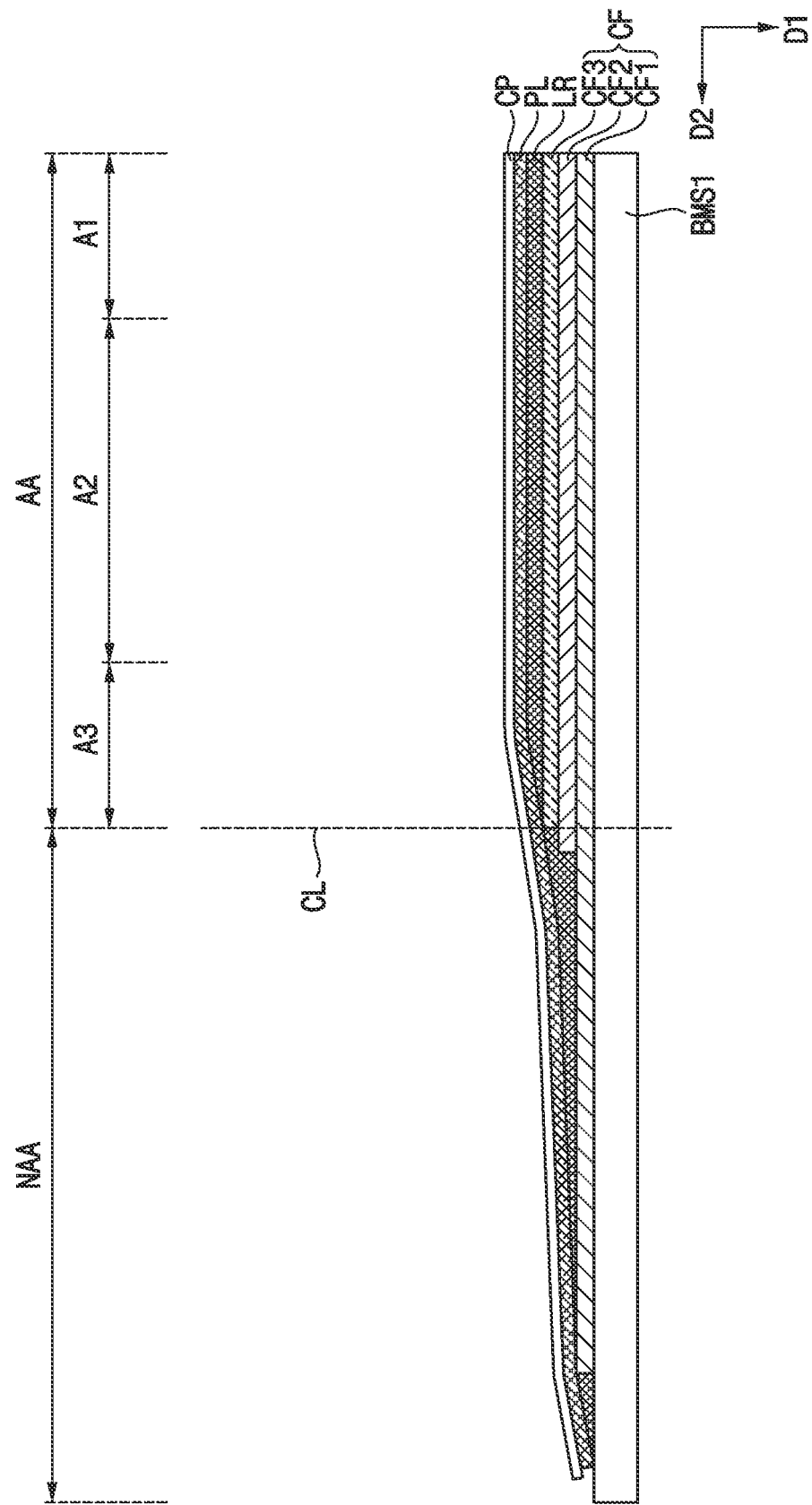

Referring to FIG. 20, a capping layer CP may be formed on the protective layer PL. The capping layer CP may cover the color conversion layer.

Figure 21:
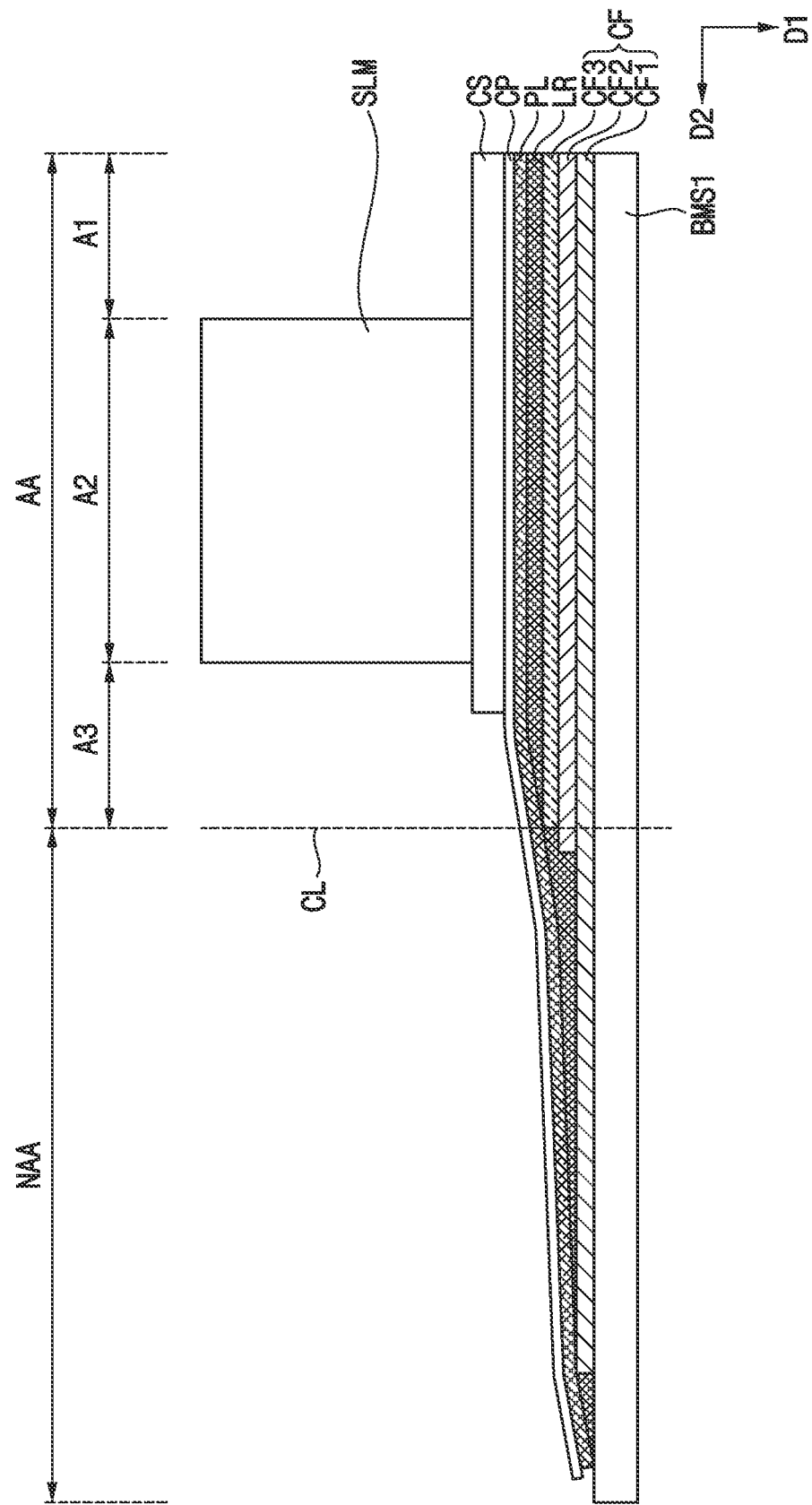

Referring to FIG. 21, a spacer CS may be formed on the capping layer CP, and a sealing member SLM may be formed on the spacer CS. The spacer CS and the sealing member SLM may be formed in the effective area AA. The sealing member SLM may be formed in the second area A2.

Figure 22:
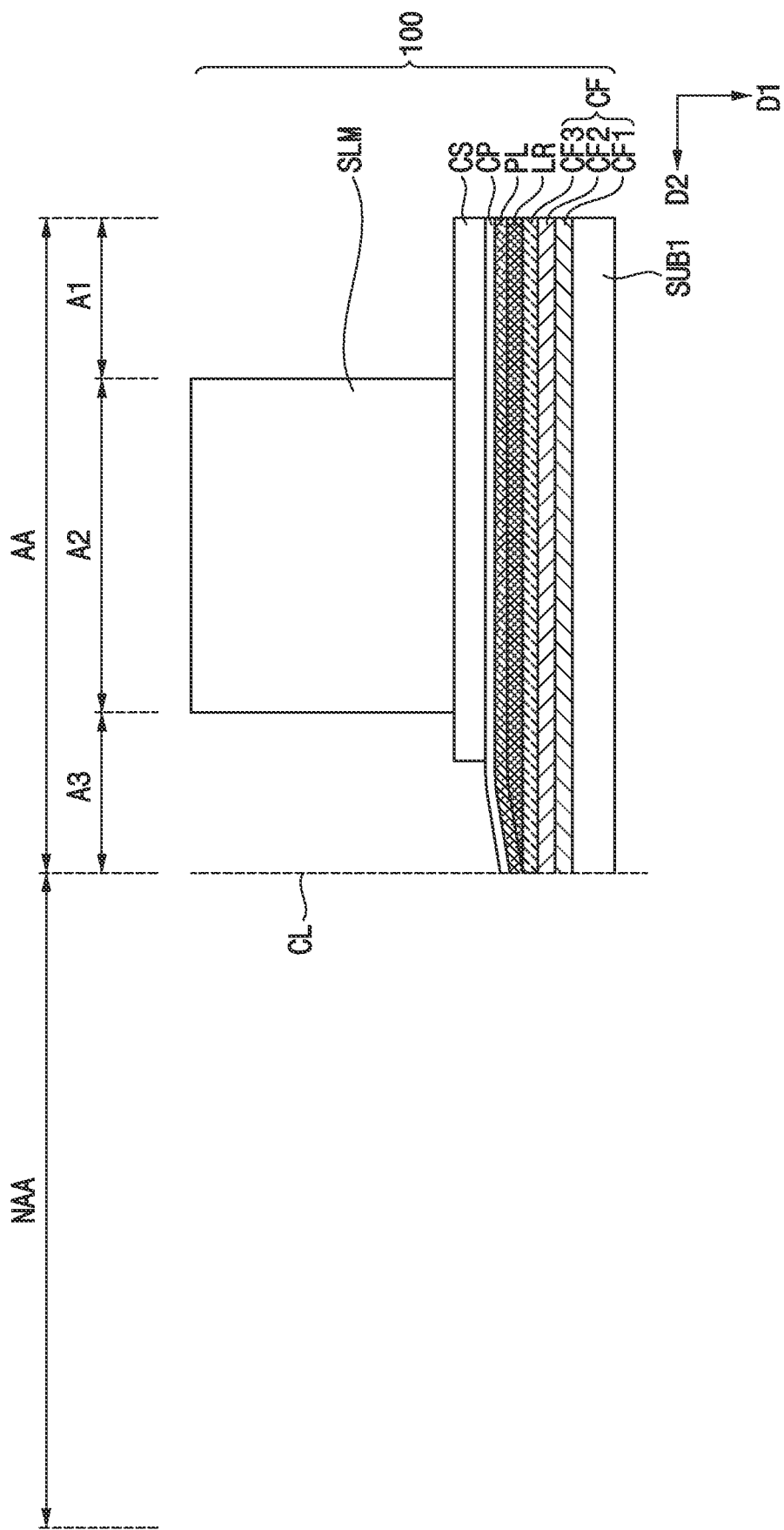

Referring to FIG. 22, the color conversion substrate 100 may be cut along the cutting line CL. Accordingly, the first base mother substrate BMS1 may form a first base substrate SUB1, and the color conversion substrate 100 including the first base substrate SUB1 may be formed. A side surface of the low refractive layer LR in the color conversion substrate 100 cut along the cutting line CL (e.g., a side surface LRa of the low refractive layer LR in FIGS. 7 and 8) may be exposed to 0 or more and about 0.7 micrometers or less (refer to FIGS. 7 and 8).

Figure 23:
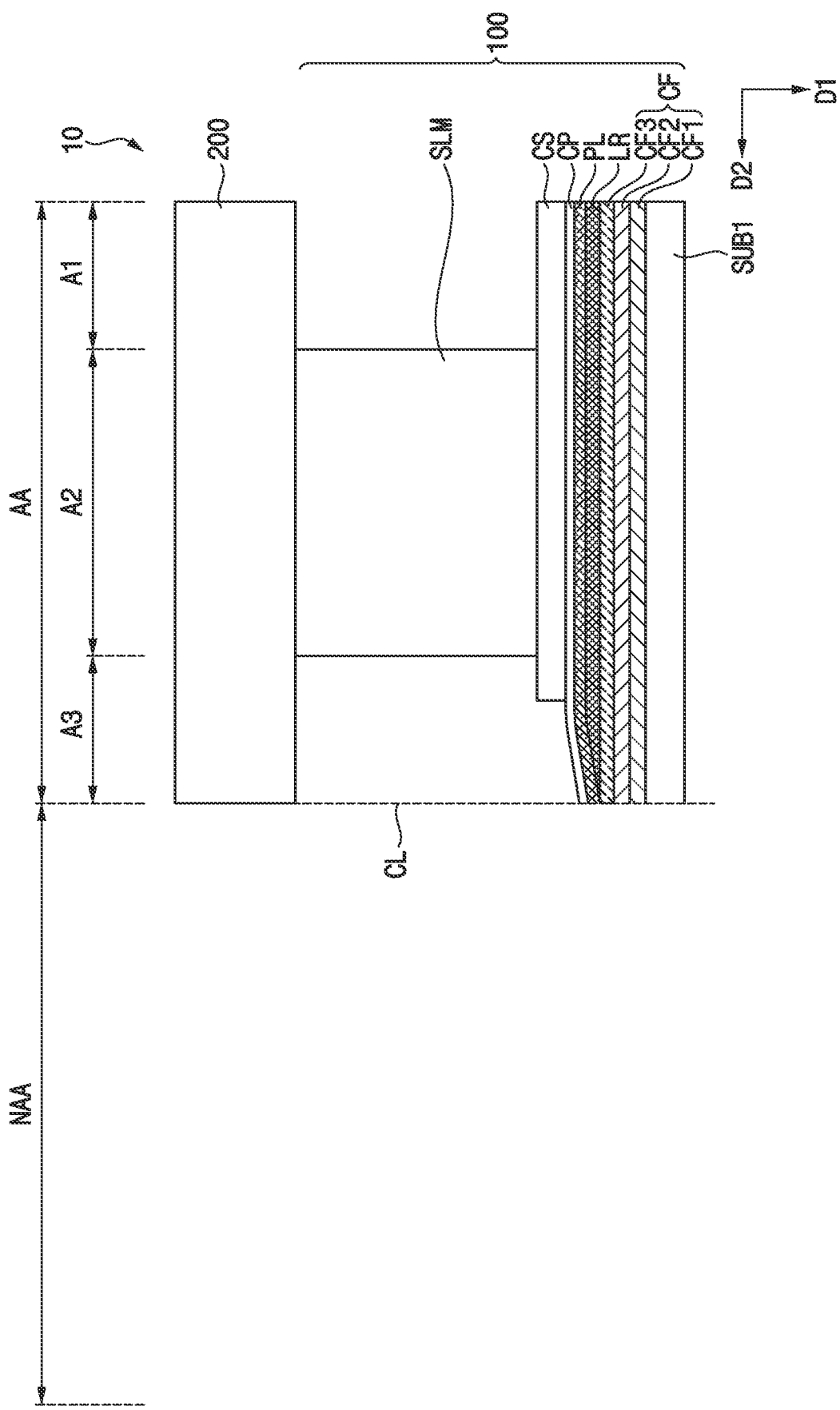

Referring to FIG. 23, an array substrate 200 facing the color conversion substrate 100 may be formed. The array substrate 200 and the color conversion substrate 100 may be bonded to each other. As such, the display device 10 may be formed.

In one or more embodiments, when the color conversion substrate 100 is formed, as at least one color filter pattern (e.g., at least one selected from among the second color filter pattern CF2 and the third color filter pattern CF3) is positioned on at least one side of the cutting line CL, the side surface of the low refractive layer LR may not be exposed or may be exposed by about 0 or more and about 0.7 micrometers or less. Consequently, the thickness of the exposed side surface of the low refractive layer LR (e.g., the thickness T1 of FIG. 8) may be reduced due to the leveling phenomenon of the low refractive layer LR. The intrusion of external materials through the low refractive layer LR may be prevented or reduced. As a result, defects of the display device 10 are prevented or reduced, and the reliability of the display device 10 may be improved.

FIGS. 24 to 30 are views illustrating a method of manufacturing a display device according to one or more embodiments of the present disclosure.

For example, in one or more embodiments, a method of manufacturing a display device described with reference to FIGS. 24 to 30 may be substantially the same as the method of manufacturing the display device described with reference to FIGS. 11 to 23 except for the color filter layer CF and the low refractive layer LR. Therefore, the overlapping description may not be provided herein for conciseness.

Figure 24:
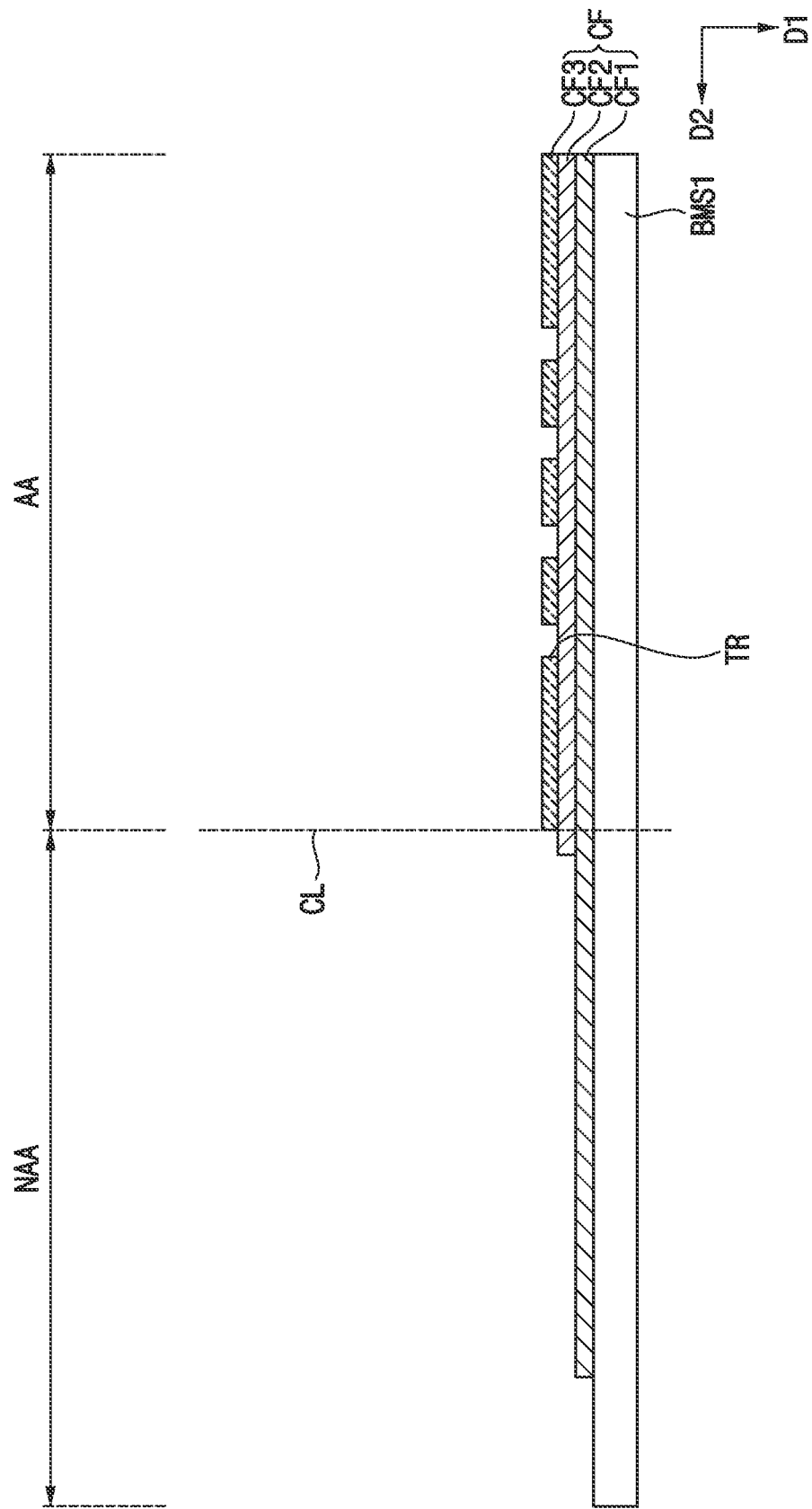
FIGS. 24-30 are views illustrating a method of manufacturing a display device according to one or more embodiments of the present disclosure.

Referring to FIG. 24, a color filter layer CF may be formed on a first base mother substrate BMS1. Trenches TR may be formed in the color filter layer CF. The trenches TR may be formed in the effective area AA.

For example, in one or more embodiments, the trenches TR may be formed in the third color filter pattern CF3 included in the color filter layer CF. However, embodiments of the present disclosure are not limited thereto, for example, in some embodiments, the trenches TR may be selectively formed in the second color filter pattern CF2 and the first color filter pattern CF1 as well.

Figure 25:
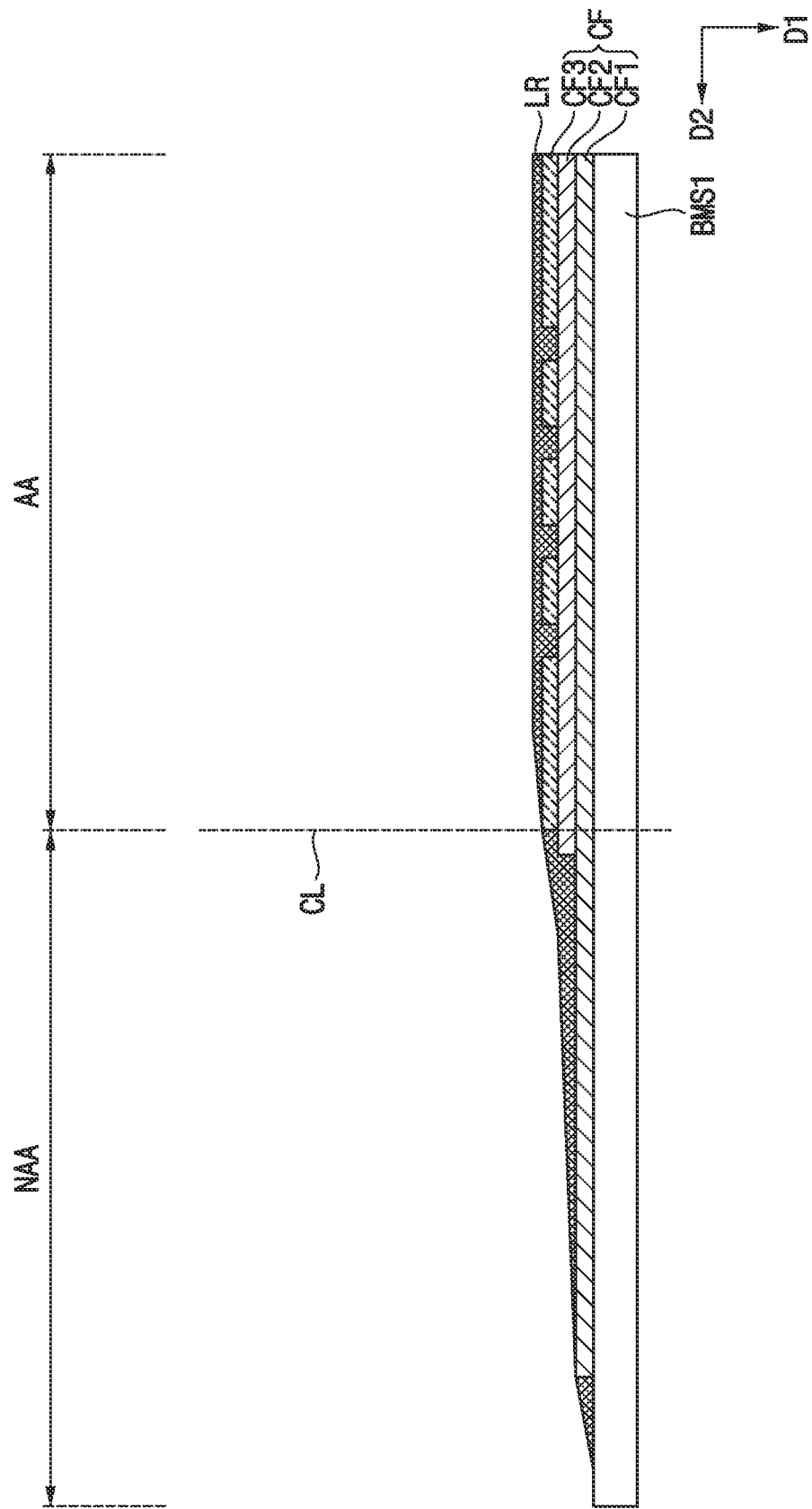

Referring to FIG. 25, a low refractive layer LR may be formed on the color filter layer CF. The low refractive layer LR may be formed of an organic material, and a portion of the low refractive layer LR may be formed to fill an inside of the trenches TR.

Figure 26:
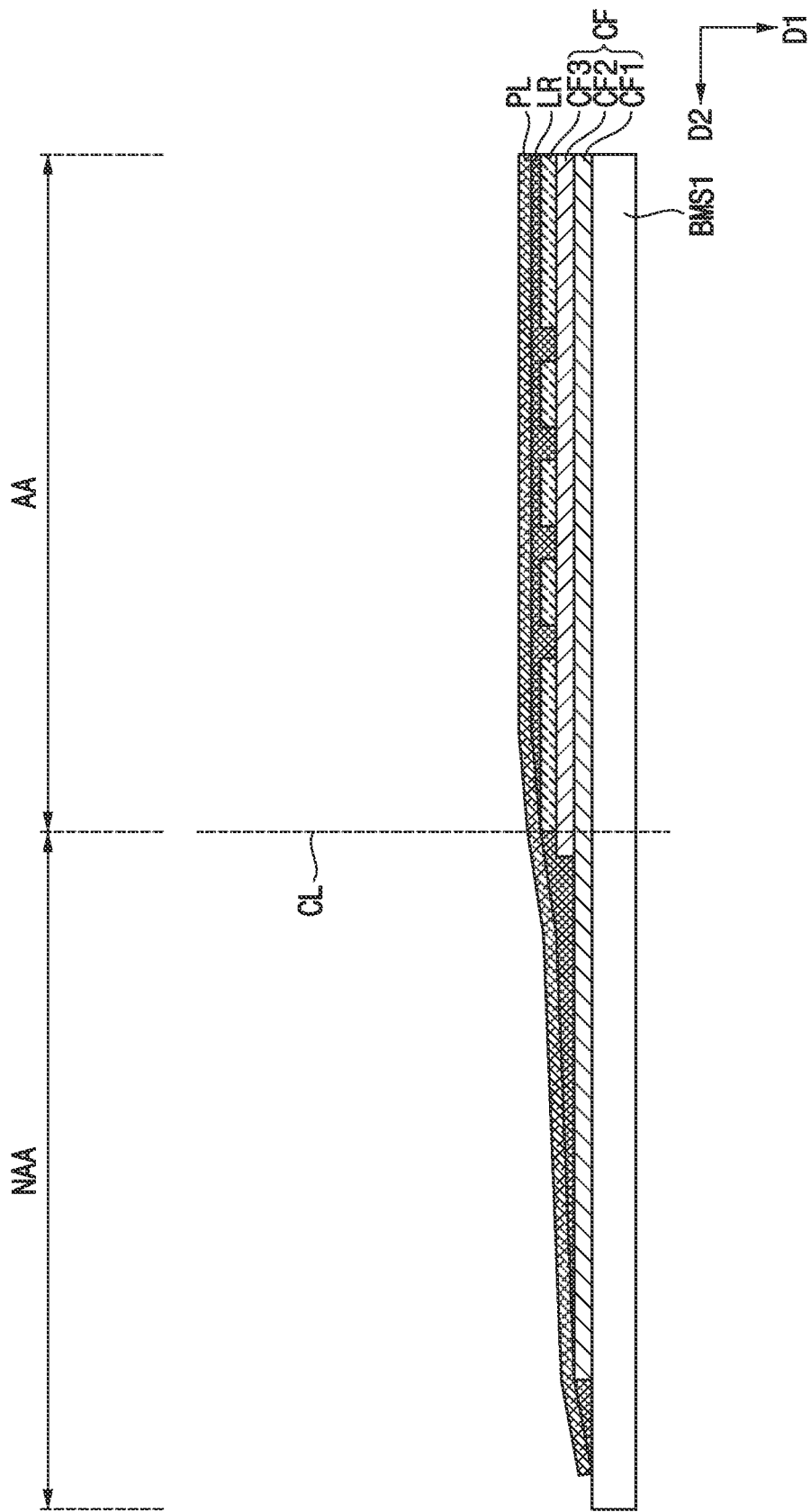
Figure 27:
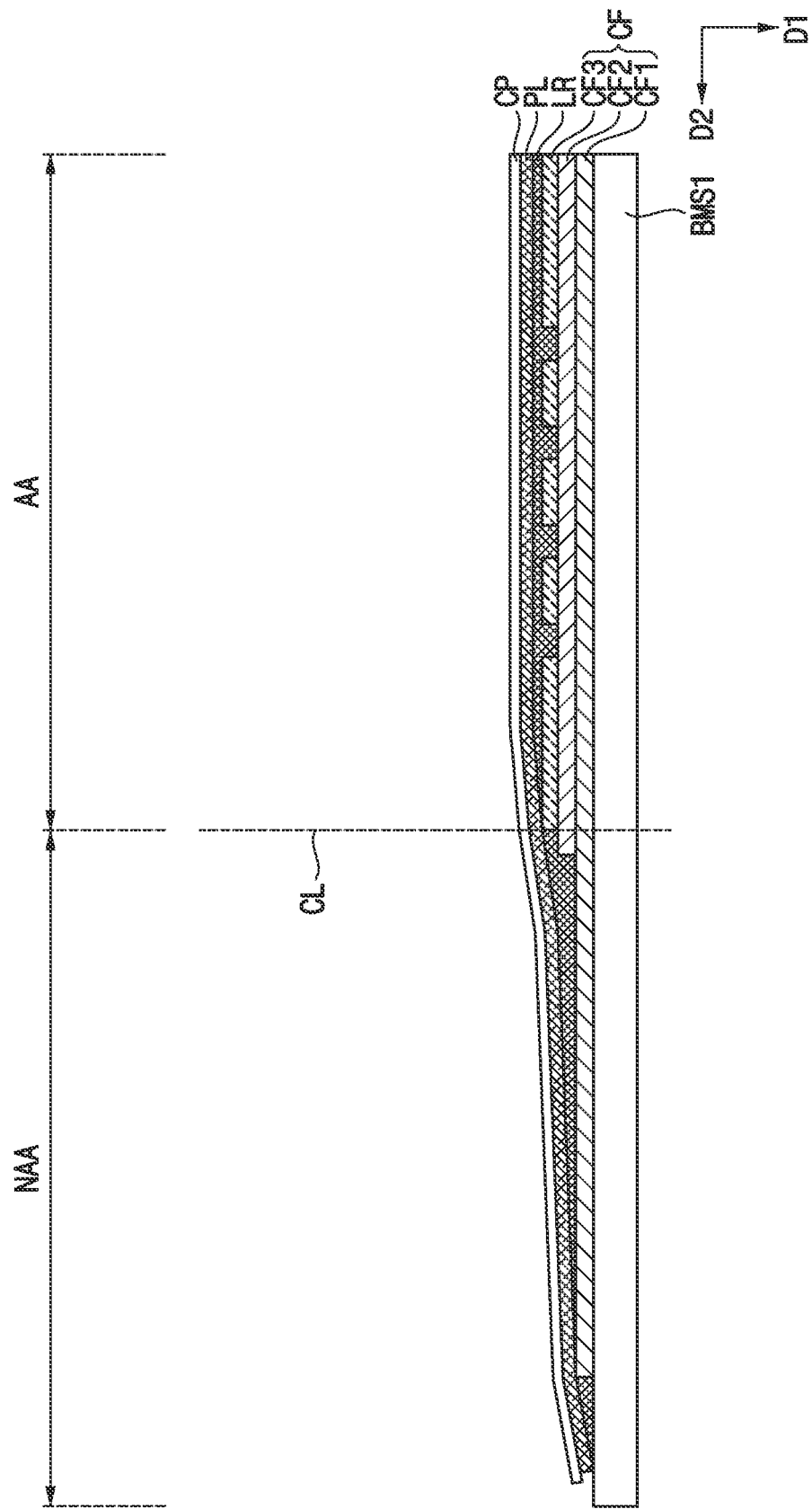

Referring to FIGS. 26 and 27, a protective layer PL may be formed on the low refractive layer LR. A capping layer CP may be formed on the protective layer PL.

Figure 28:
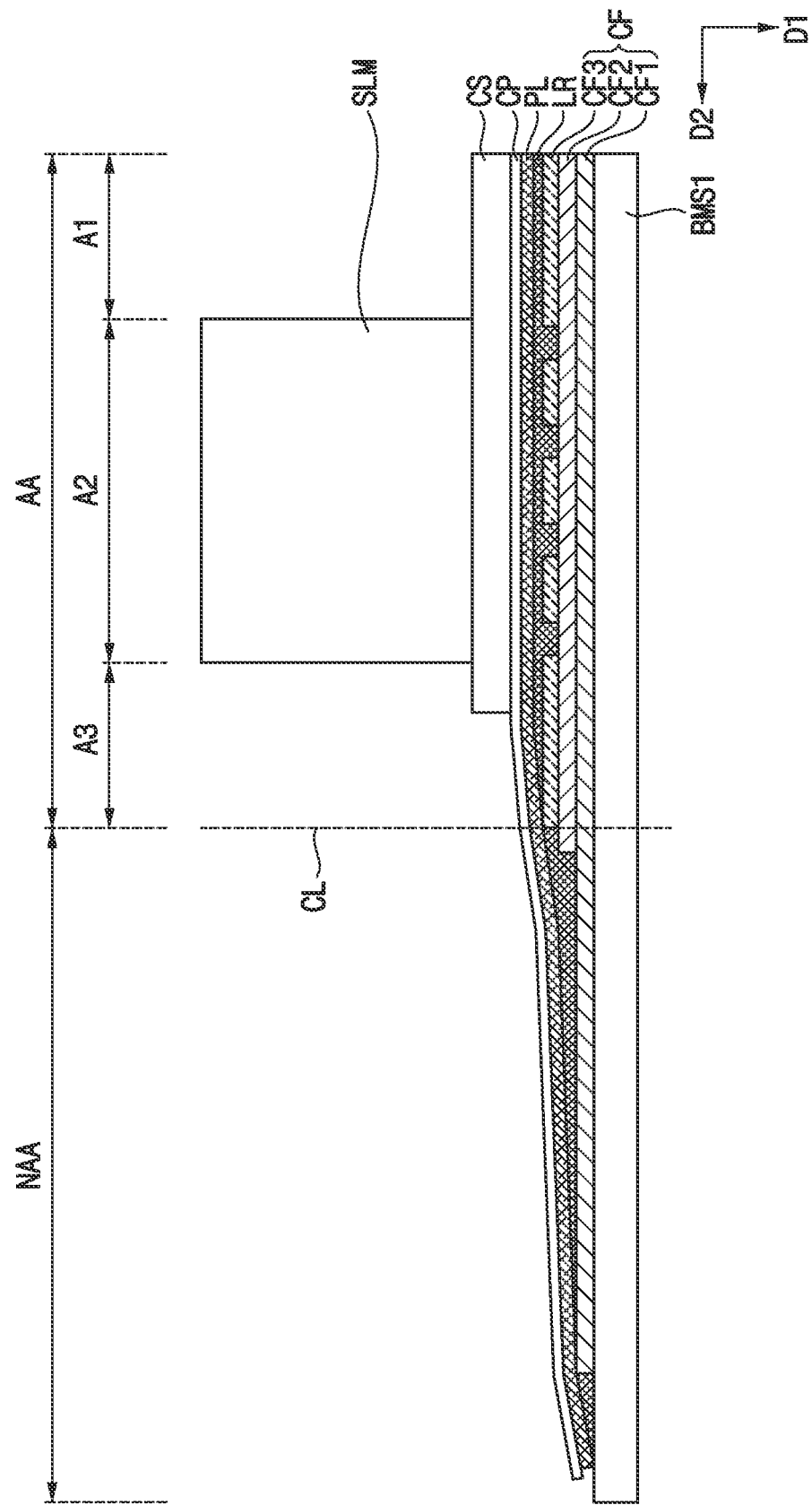

Referring to FIG. 28, a spacer CS may be formed in the effective area AA on the capping layer CP. A sealing member SLM may be formed on the spacer CS. The sealing member SLM may be disposed in the second area A2 and may overlap the trenches TR.

Figure 29:
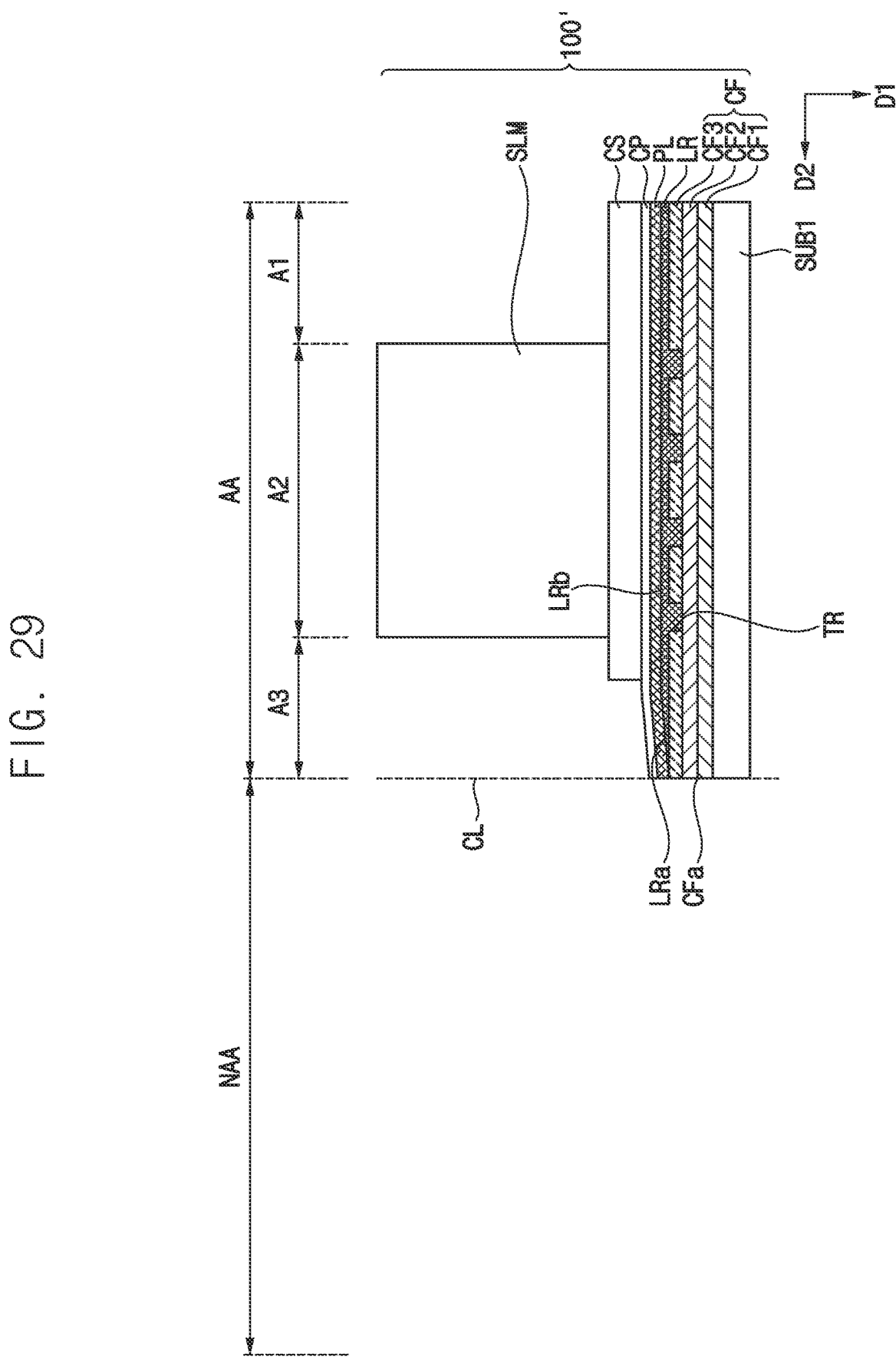
Figure 30:
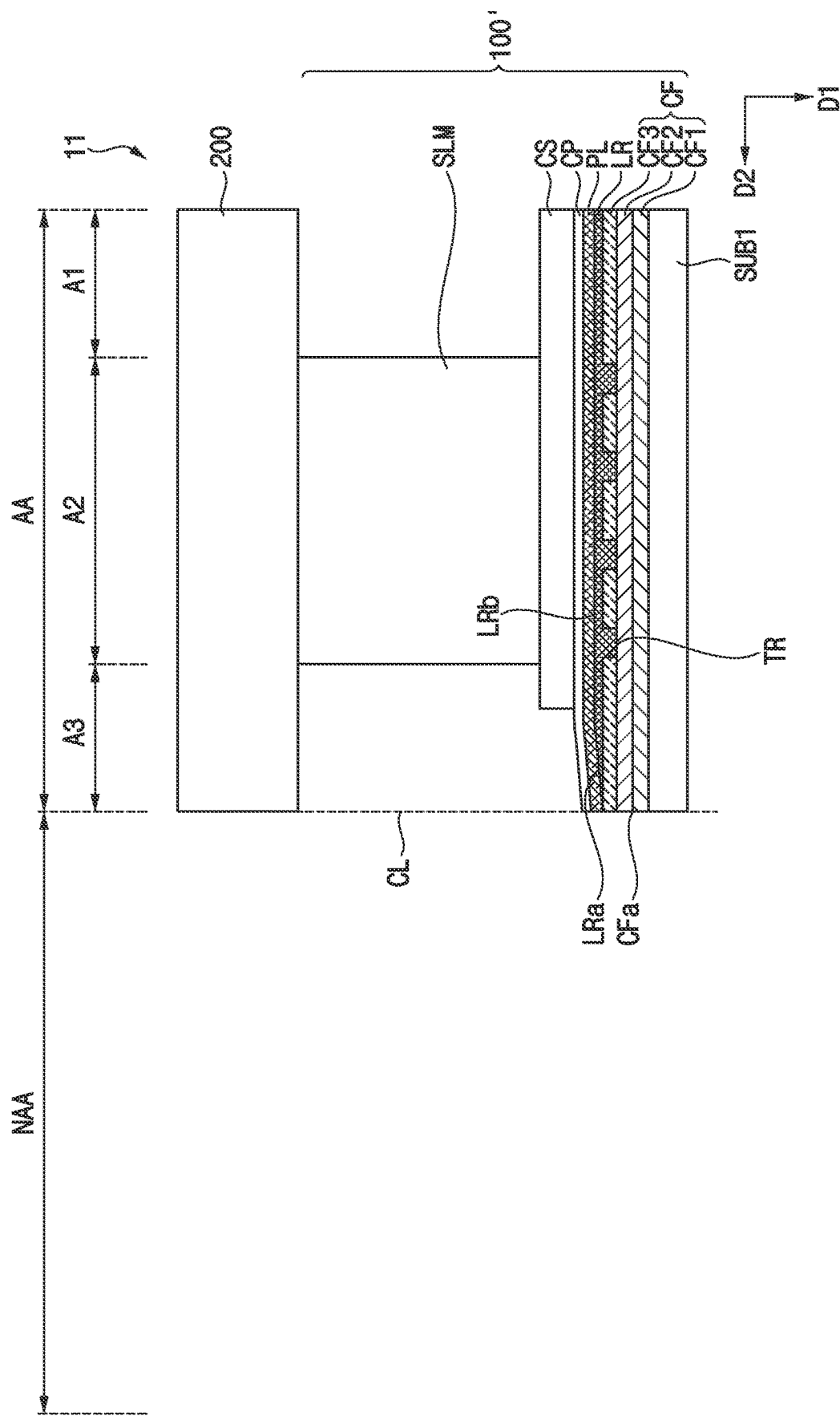

Referring to FIGS. 29 and 30, a color conversion substrate 100' may be cut along a cutting line CL. A side surface of the low refractive layer LR in the color conversion substrate 100' cut along the cutting line CL (e.g., the side surface LRa of the low refractive layer LR in FIG. 10) may be exposed to a thickness of 0 micrometers or more (e.g., not less than 0 micrometers) and about 0.7 micrometers or less (e.g., not greater than 0.7 micrometers).

An array substrate 200 facing the color conversion substrate 100' may be formed. The array substrate 200 and the color conversion substrate 100' may be bonded to each other. As such, the display device 11 may be formed.

In one or more embodiments, as the trenches TR are formed in the color filter layer CF, and a portion of the low refractive layer LR fills the inside of the trenches TR, the thickness of the side surface of the low refractive layer LR may be reduced. Accordingly, as the thickness of the exposed side surface of the low refractive layer LR is reduced due to the leveling phenomenon of the low refractive layer LR, defects of the display device 11 may be prevented or reduced, and thus the reliability of the display device 11 may be improved.

FIGS. 31 to 36 are views illustrating a method of manufacturing a display device according to one or more embodiments of the present disclosure.

For example, in one or more embodiments, a method of manufacturing a display device described with reference to FIGS. 31 to 36 may be substantially the same as the method of manufacturing the display device described with reference to FIGS. 24 to 30, except for the color filter layer CF and the low refractive layer LR. Therefore, the overlapping description may not be provided herein for conciseness.

Figure 31:
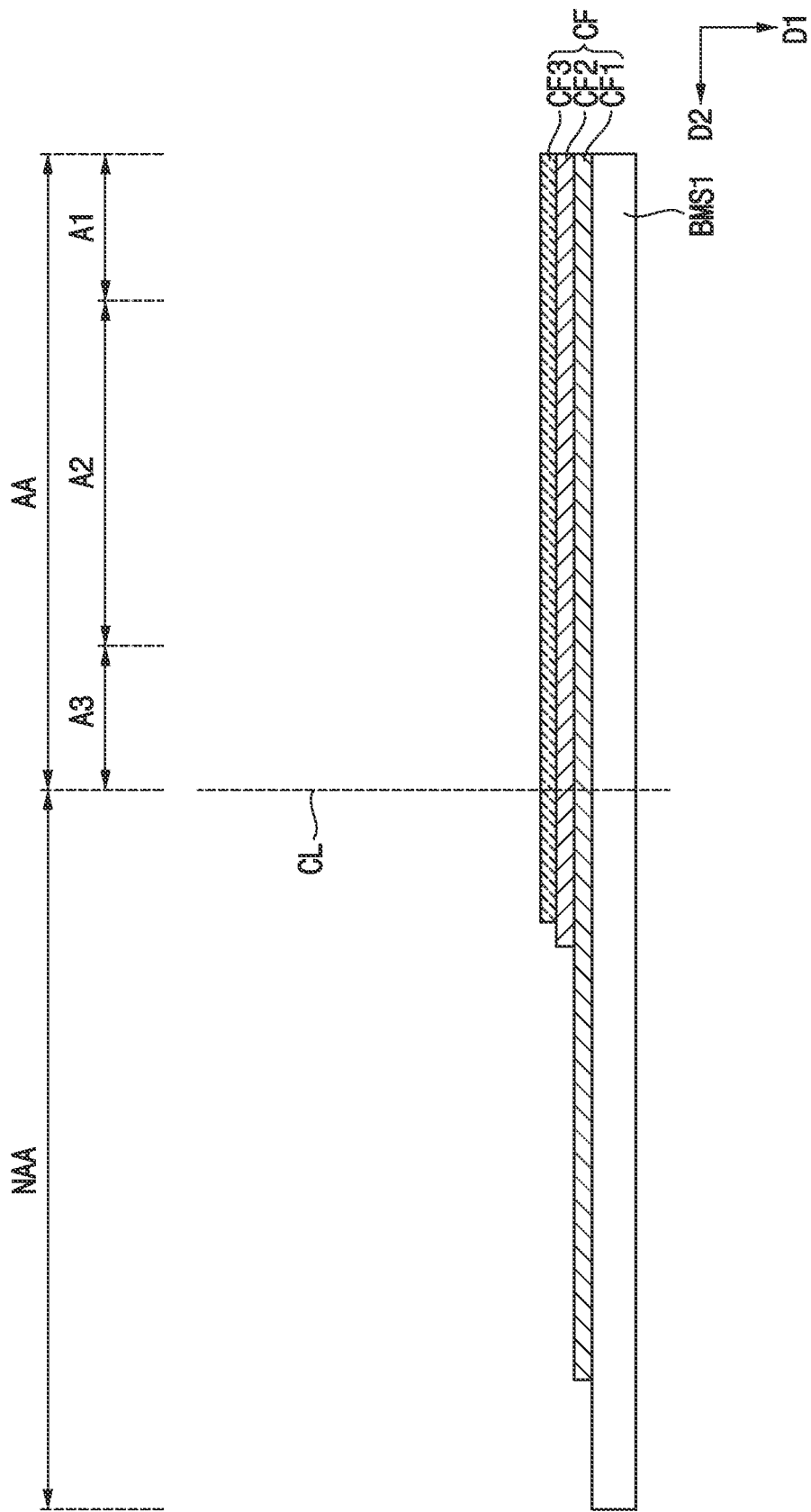
FIGS. 31-36 are views illustrating a method of manufacturing a display device according to one or more embodiments of the present disclosure.

Referring to FIG. 31, a color filter layer CF may be formed on a first base mother substrate BMS1. One end of each of a second color filter pattern CF2 and a third color filter pattern CF3 included in the color filter layer CF may be spaced apart from a cutting line CL.

Figure 32:
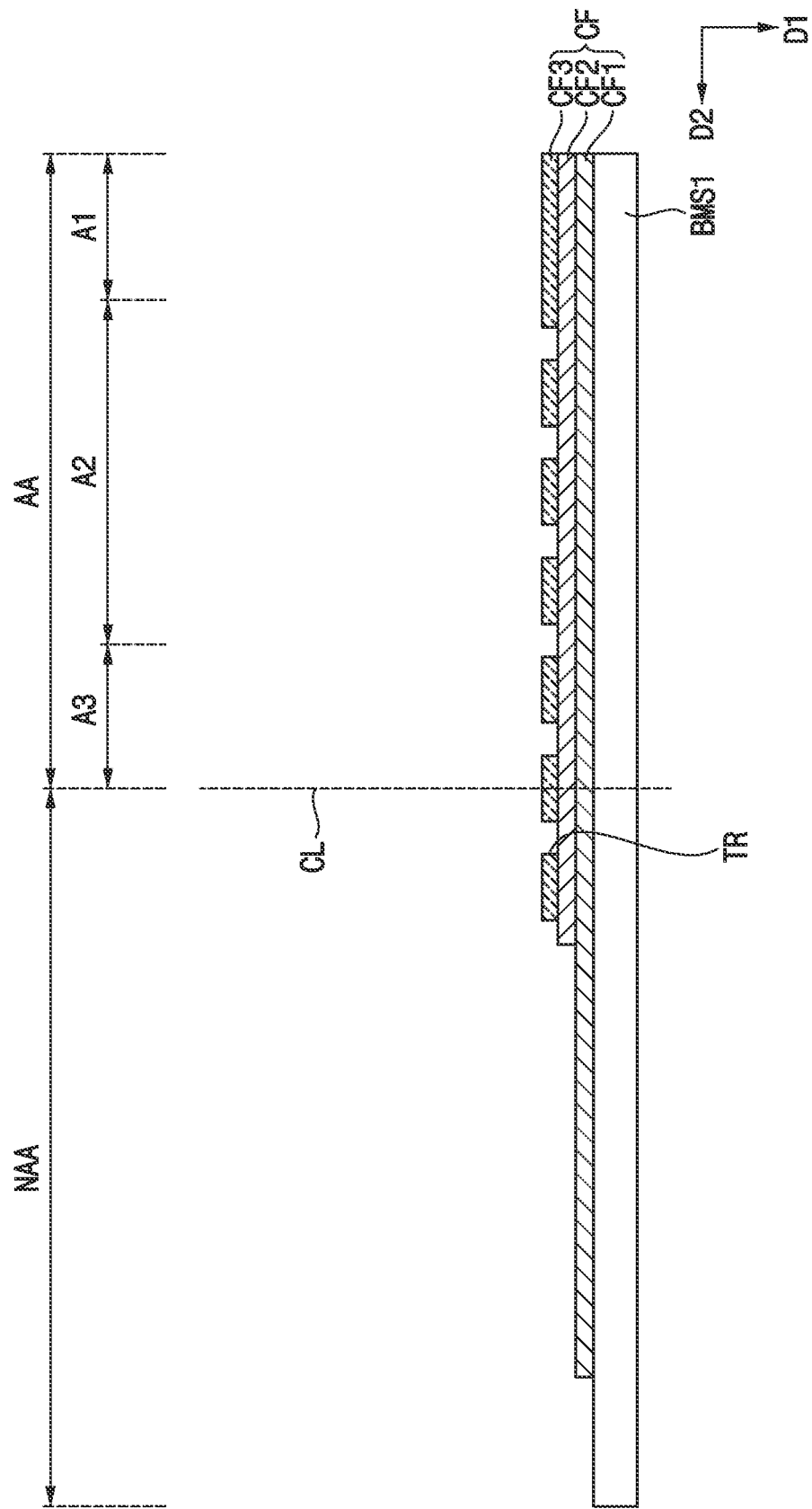

Referring further to FIG. 32, trenches TR may be formed in the color filter layer CF. The trenches TR may be formed in the effective area AA and the ineffective area NAA.

For example, in one or more embodiments, the trenches TR may be formed in the third color filter pattern CF3 included in the color filter layer CF. However, embodiments of the present disclosure are not limited thereto, for example, in some embodiments, trenches TR may be formed in the second color filter pattern CF2 and a first color filter pattern CF1 as well.

Figure 33:
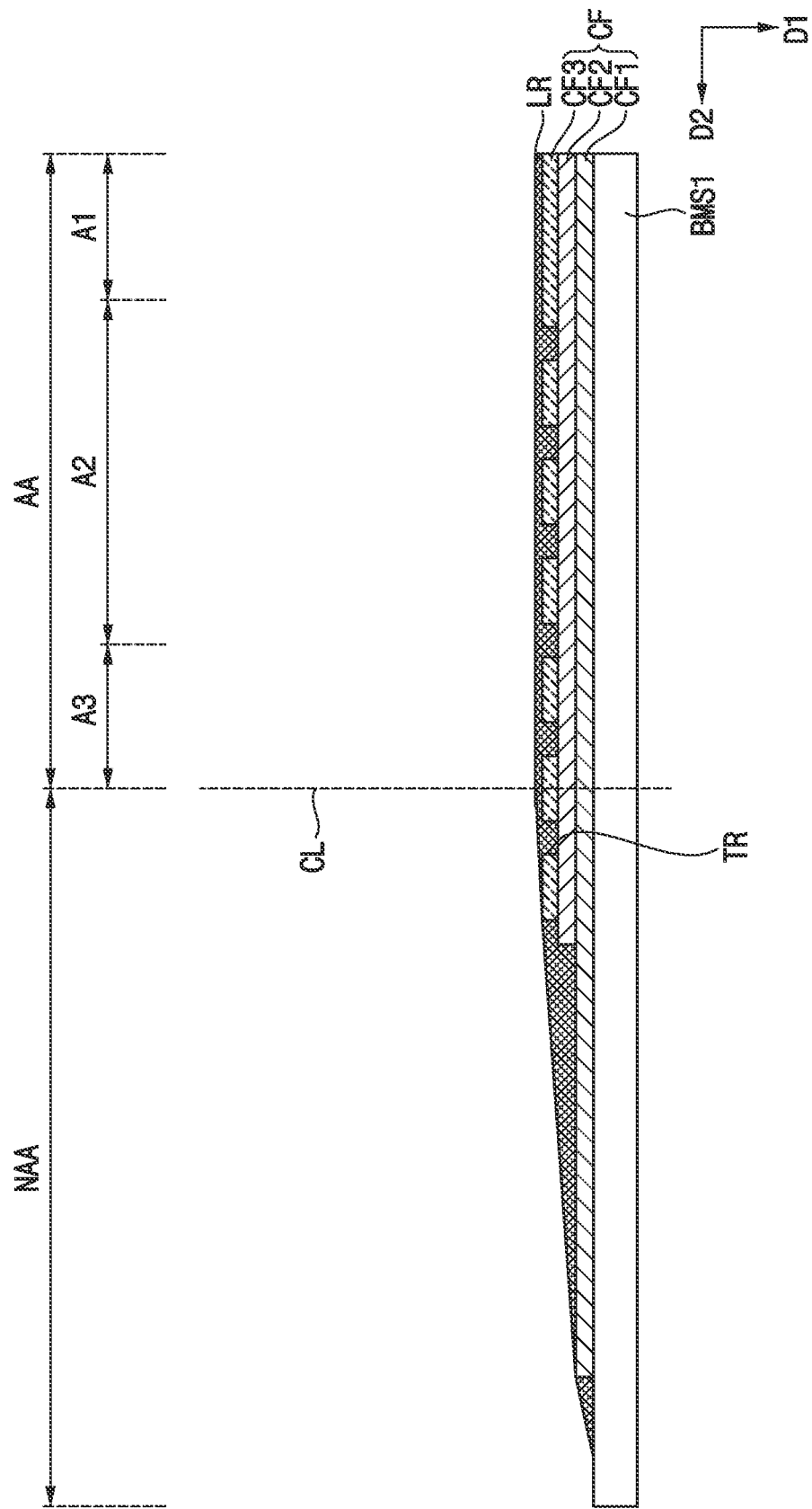

Referring to FIG. 33, a low refractive layer LR may be formed on the color filter layer CF. The low refractive layer LR may be formed of an organic material, and a portion of the low refractive layer LR may be formed to fill an inside of the trenches TR.

Figure 34:
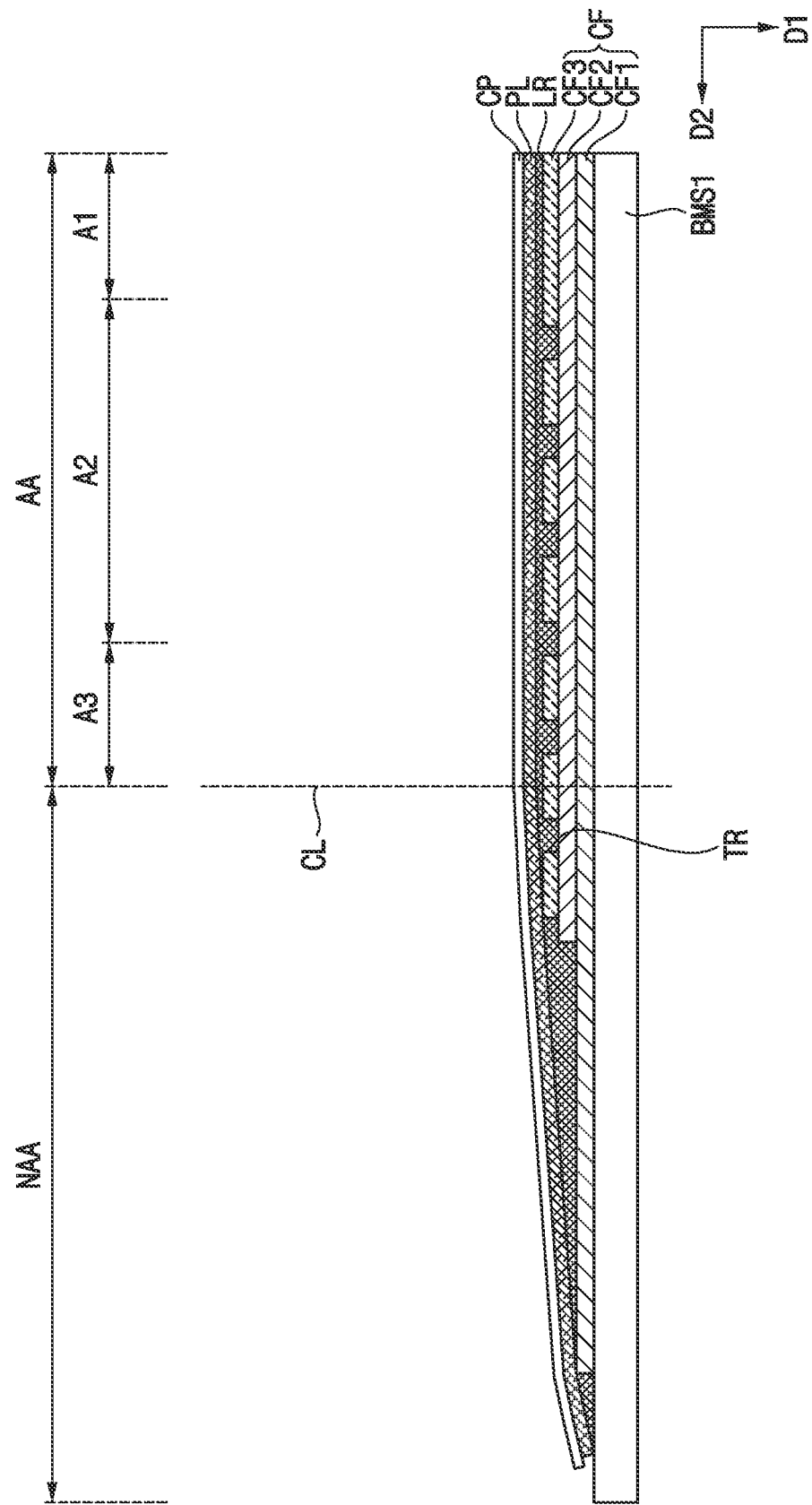
Figure 35:
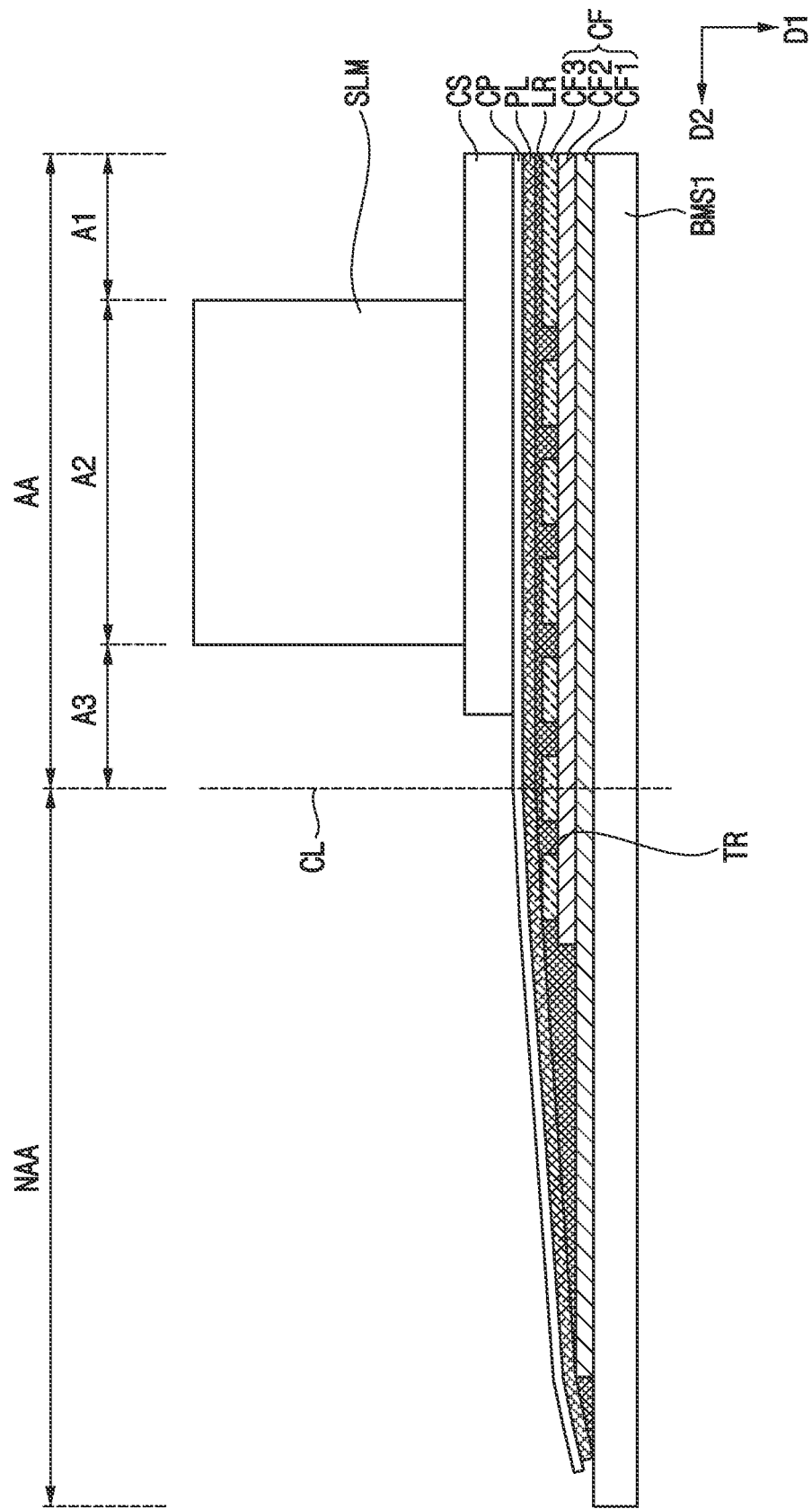

Referring to FIGS. 34 and 35, a protective layer PL may be formed on the low refractive layer LR. A capping layer CP may be formed on the protective layer PL.

A spacer CS may be formed in the effective area AA on the capping layer CP. A sealing member SLM may be formed on the spacer CS. The sealing member SLM is disposed in the second area A2 and may overlap the trenches TR.

Figure 36:
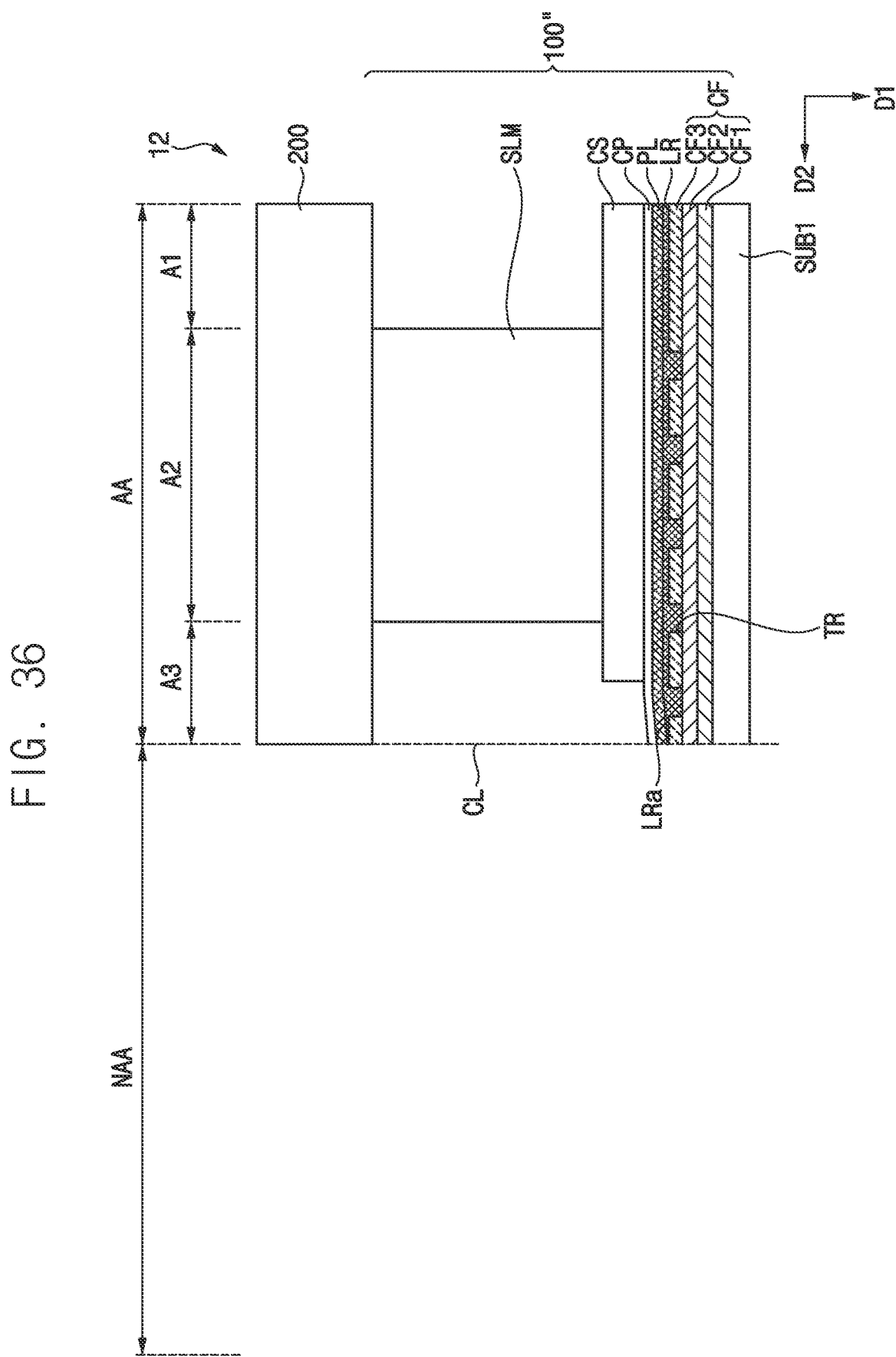

Referring to FIG. 36, a color conversion substrate may be cut along a cutting line CL. Accordingly, the color conversion substrate 100" may be formed. The cutting line CL may be spaced apart from the trenches TR. Consequently, in the color conversion substrate 100" cut along the cutting line CL, a side surface LRa of the low refractive layer LR (e.g., the side surface LRa of the low refractive layer LR of FIG. 10) may be exposed to a thickness of about 0.7 micrometers or less.

An array substrate 200 facing the color conversion substrate 100" may be formed. The array substrate 200 and the color conversion substrate 100" may be bonded to each other. As such, the display device 12 may be formed.

In one or more embodiments, because the trenches TR are formed more in the color filter layer CF, the exposed thickness of the low refractive layer LR may be reduced. As a result, the intrusion of external materials through the low refractive layer LR may be prevented or reduced. As the thickness of the exposed side surface of the low refractive layer LR decreases due to the leveling phenomenon of the low refractive layer LR, defects of the display device 12 may be prevented or reduced, and thus the reliability of the display device 12 may be improved.

The display devices and the methods according to embodiments of the present disclosure may be applied to a display device included in a computer, a notebook, a mobile phone, a smartphone, a smart pad, a PMP, a PDA, an MP3 player, and/or the like.

In the present disclosure, when particles are spherical, "diameter" indicates an average particle diameter, and when the particles are non-spherical, the "diameter" indicates a major axis length. The diameter (or size) of the particles may be measured utilizing a scanning electron microscope or a particle size analyzer. As the particle size analyzer, for example, HORIBA, LA-950 laser particle size analyzer, may be utilized. When the size of the particles is measured utilizing a particle size analyzer, the average particle diameter (or size) is referred to as D50. D50 refers to the average diameter (or size) of particles whose cumulative volume corresponds to 50 vol % in the particle size distribution (e.g., cumulative distribution), and refers to the value of the particle size corresponding to 50% from the smallest particle when the total number of particles is 100% in the distribution curve accumulated in the order of the smallest particle size to the largest particle size.

As used herein, the term "substantially," "about," and similar terms are used as terms of approximation and not as terms of degree, and are intended to account for the inherent deviations in measured or calculated values that would be recognized by those of ordinary skill in the art. "About" or "substantially" as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Although the display devices and the methods according to embodiments of the present disclosure have been described with reference to the drawings, the illustrated embodiments are examples, and may be modified and changed by a person having ordinary knowledge in the relevant technical field without departing from the technical spirit described in the following claims and equivalents thereof.

What is claimed is:

1. A color conversion substrate comprising:
   a first base substrate comprising a first area, a second area around the first area, and a third area around the second area;
   a sealing member on the first base substrate and in the second area;
   a color filter layer on the first base substrate and under the sealing member; and
   a low refractive layer on the color filter layer, under the sealing member, and increasing in thickness from the third area to the second area in at least a portion of the third area,
   wherein the sealing member comprises an inner side adjacent to the first area and an outer side opposite to the inner side and adjacent to the third area, and
   a portion in which the thickness of the low refractive layer increases is adjacent to the outer side of the sealing member.

2. The color conversion substrate of claim 1, wherein a portion of the low refractive layer overlapping the first area and the second area has a greater thickness than a portion of the low refractive layer overlapping the third area.

3. The color conversion substrate of claim 1, wherein the low refractive layer comprises an organic material.

4. The color conversion substrate of claim 1, further comprising:
   a protective layer on the low refractive layer.

5. The color conversion substrate of claim 4, wherein a side surface of the color filter layer and a side surface of the protective layer are exposed.

6. The color conversion substrate of claim 4, wherein the protective layer covers an end of the low refractive layer.

7. The color conversion substrate of claim 4, wherein the protective layer exposes a side surface of the low refractive layer, and
   a thickness of the exposed side surface of the low refractive layer is more than about 0 and about 0.7 micrometers or less.

8. The color conversion substrate of claim 1, wherein trenches are defined in the color filter layer.

9. The color conversion substrate of claim 8, wherein the trenches overlap the sealing member, and
   a portion of the low refractive layer fills an inside of the trench.

10. A display device comprising:
    a first base substrate comprising a first area, a second area around the first area, and a third area around the second area;
    a second base substrate facing the first base substrate;
    a sealing member between the first base substrate and the second base substrate;
    a color filter layer under the first base substrate and on the sealing member;
    a light-emitting element on the second base substrate and in the first area;
    an encapsulation layer between the light-emitting element and the color filter layer, the encapsulation layer comprising a first inorganic encapsulation layer on the light-emitting element, an organic encapsulation layer on the first inorganic encapsulation layer, and a second inorganic encapsulation layer on the organic encapsulation layer; and
    a low refractive layer between the encapsulation layer and the color filter layer, on the sealing member, and increasing in thickness from the third area to the second area in at least a portion of the third area.

11. The display device of claim 10, wherein a portion of the low refractive layer overlapping the first area and the second area has a greater thickness than a portion of the low refractive layer overlapping the third area.

12. The display device of claim 10, further comprising:
    a protective layer under the low refractive layer.

13. The display device of claim 12, wherein the protective layer covers the low refractive layer, and
    a thickness of a side surface of the low refractive layer is about 0.7 micrometers or less.

14. The display device of claim 10, wherein trenches overlapping the sealing member are defined in the color filter layer.

* * * * *